(12) United States Patent
Madurawe

(10) Patent No.: US 7,759,969 B2
(45) Date of Patent: Jul. 20, 2010

(54) PROGRAMMABLE LOGIC DEVICES COMPRISING TIME MULTIPLEXED PROGRAMMABLE INTERCONNECT

(75) Inventor: Raminda Udaya Madurawe, Sunnyvale, CA (US)

(73) Assignee: Tier Logic, Inc., Santa Clara, CA (US)

( * ) Notice: Subject to any disclaimer, the term of this patent is extended or adjusted under 35 U.S.C. 154(b) by 88 days.

(21) Appl. No.: 12/245,753

(22) Filed: Oct. 5, 2008

(65) Prior Publication Data

US 2009/0243650 A1 Oct. 1, 2009

Related U.S. Application Data

(62) Division of application No. 11/369,541, filed on Mar. 8, 2006, now Pat. No. 7,486,111.

(51) Int. Cl.
*H03K 19/173* (2006.01)
(52) U.S. Cl. .......................... 326/38; 326/39
(58) Field of Classification Search ............. 326/38–41, 326/47
See application file for complete search history.

(56) References Cited

U.S. PATENT DOCUMENTS

| | | | |
|---|---|---|---|
| 5,781,031 A | | 7/1998 | Bertin |
| 5,925,920 A | * | 7/1999 | MacArthur et al. ......... 257/530 |
| 6,621,296 B2 | * | 9/2003 | Carberry et al. ............... 326/40 |
| 2004/0178819 A1 | | 9/2004 | New |
| 2006/0195729 A1 | | 8/2006 | Huppenthal |

OTHER PUBLICATIONS

Chen Dong et al., "3-D nFPGA: A reconfigurable architecture for 3-D CMOS/Nanomaterial Hybrid Digital Circuits", IEEE Trans. Circuits and Systems, vol. 54, No. 11, Nov. 1, 2007 (pp. 2489-2501).

* cited by examiner

*Primary Examiner*—Daniel D Chang
(74) *Attorney, Agent, or Firm*—Tran & Associates

(57) ABSTRACT

A time multiplexed programmable switch of a semiconductor device comprising: a first node; and a plurality of second nodes, each of the second nodes having a path to couple to the first node, the path comprising: a first configurable device configured to select or deselect the path; and a second configurable device in series with the first configurable device configured to select or deselect the path by a digital signal; wherein, the plurality of digital signals are time multiplexed to have no more than one second device in the select state within a time interval.

20 Claims, 11 Drawing Sheets

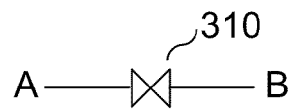
Fig-3A
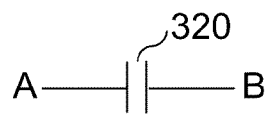
Fig-3B
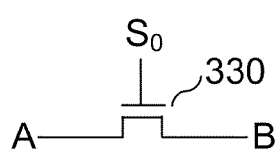
Fig-3C
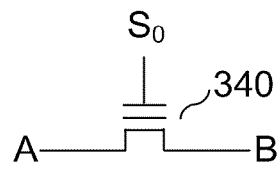
Fig-3D
Fig-3 (Related Art)
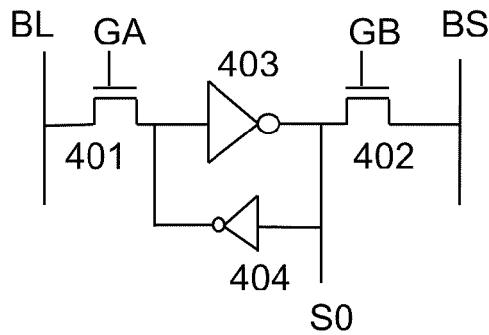
Fig-4A (Prior Art)
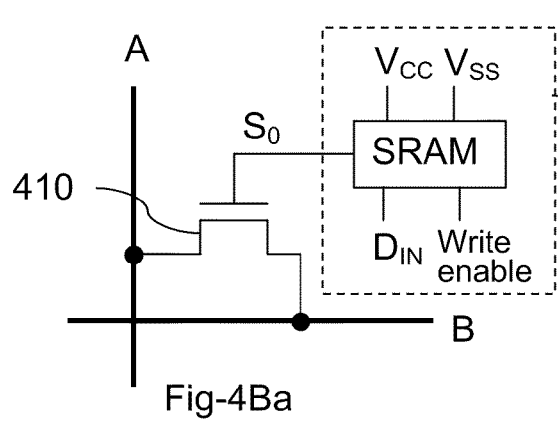
Fig-4Ba
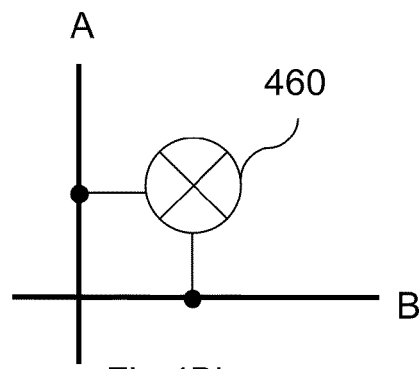
Fig-4Bb
Fig-4B (Prior Art)

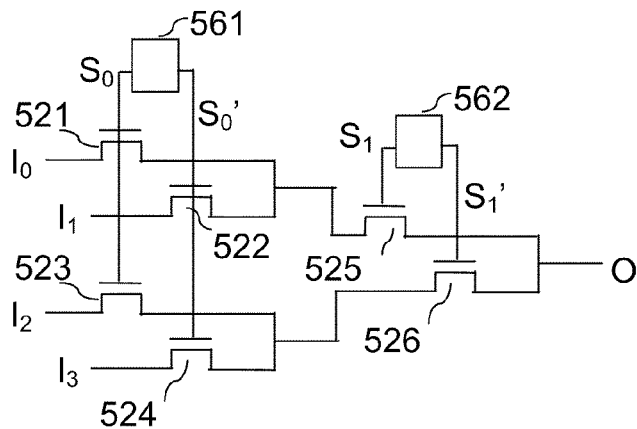
Fig-5B
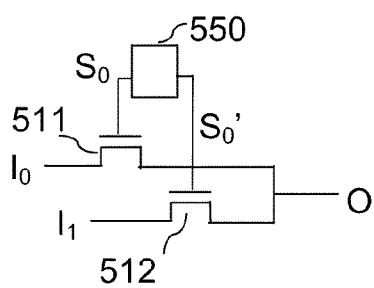
Fig-5A
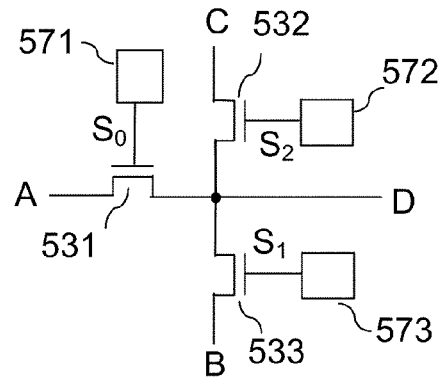
Fig-5C
Fig-5 (Prior Art)
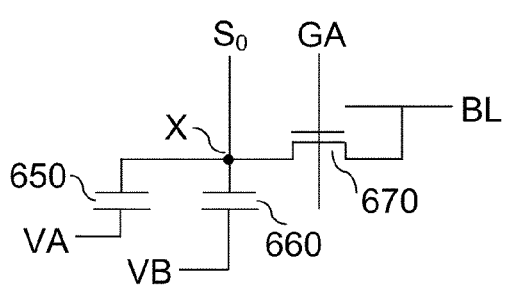
Fig-6 (Related Art)
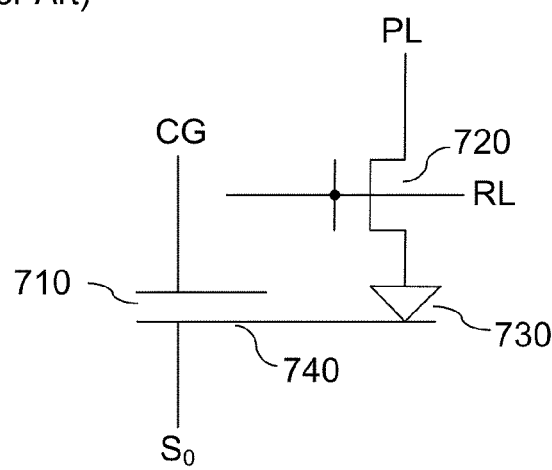
Fig-7 (Related Art)

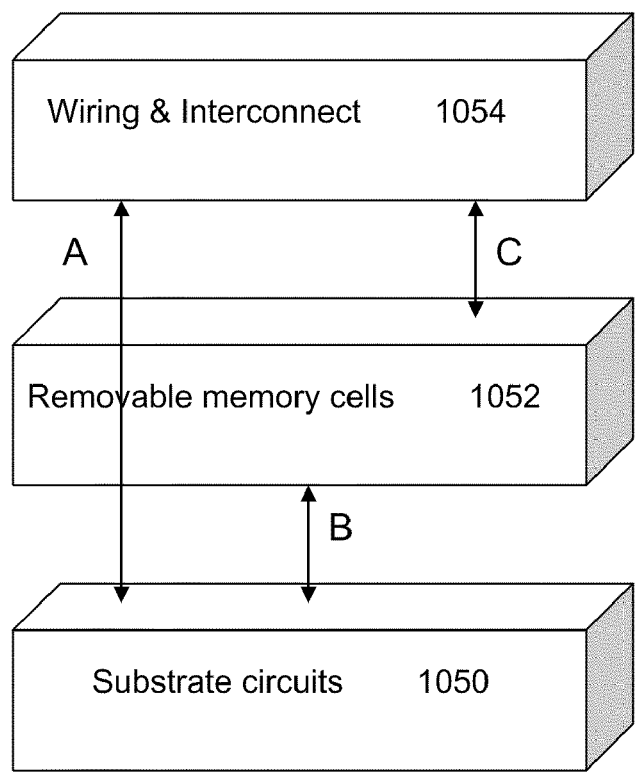
Fig-10 (Related Art)
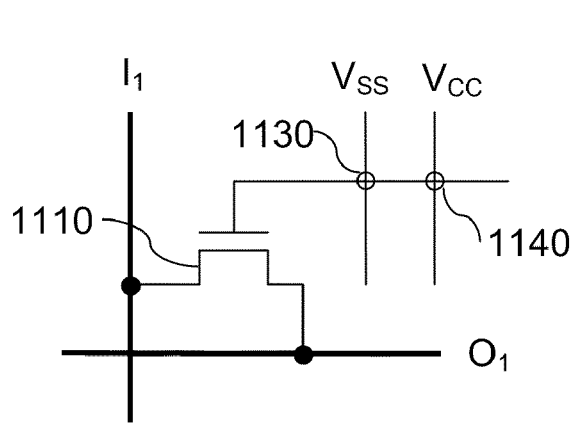
Fig-11A
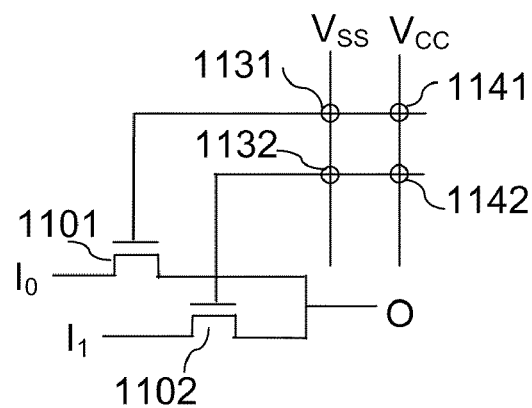
Fig-11B
Fig-11 (Related Art)

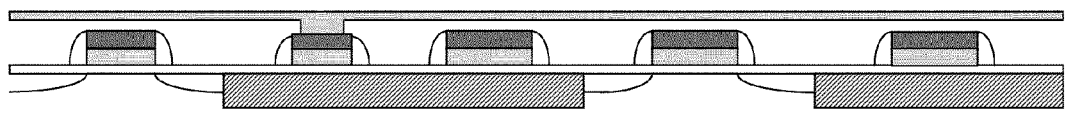
Fig - 12.1
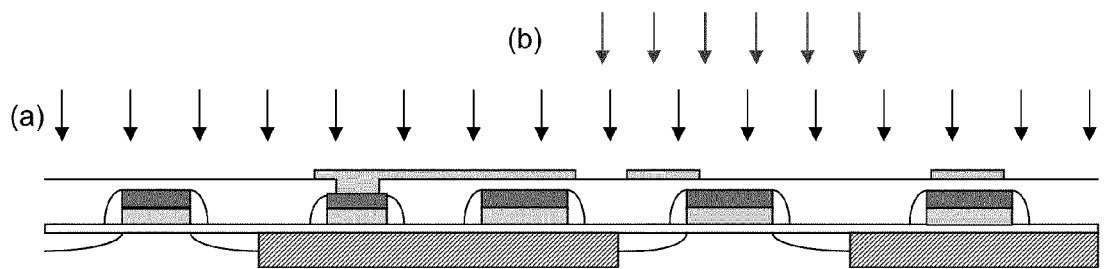
Fig - 12.2
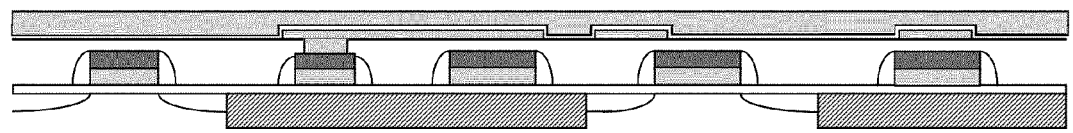
Fig - 12.3
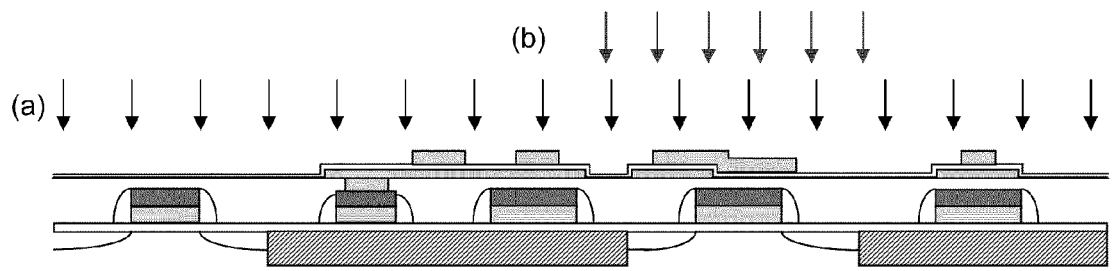
Fig - 12.4

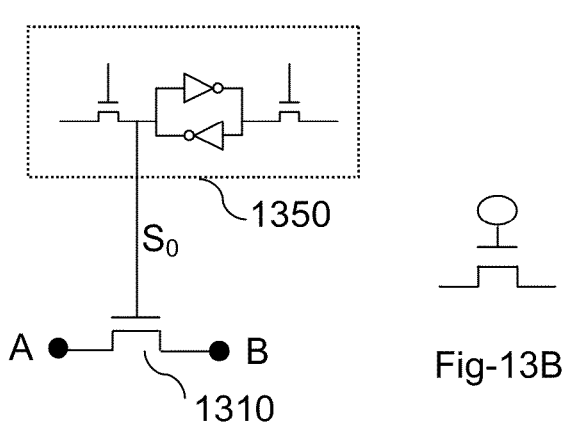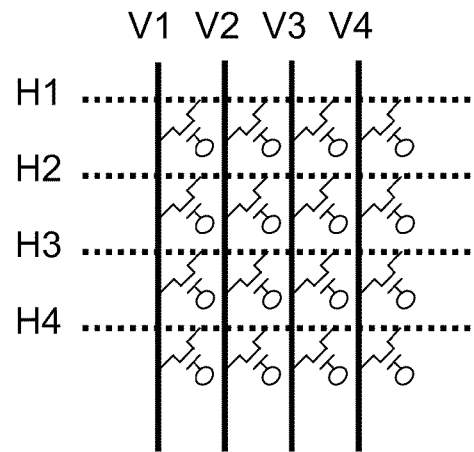
Fig-13A  Fig-13B  Fig-13C
Fig-13 (Related Art)
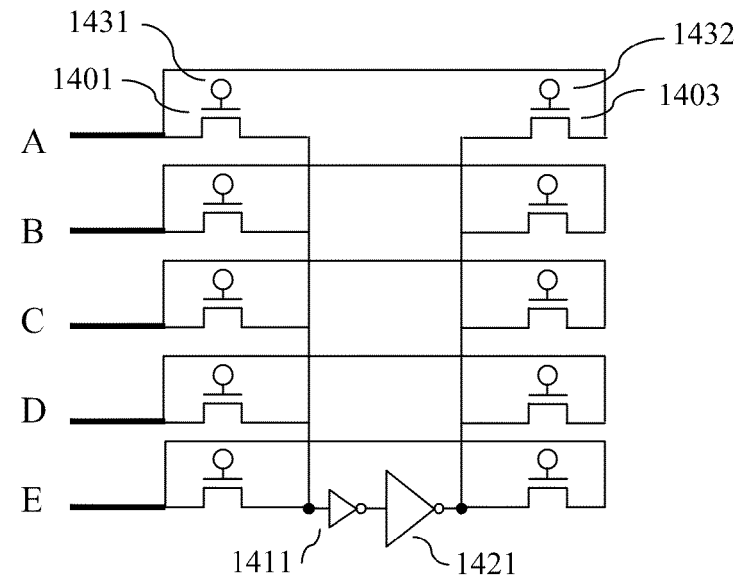
Fig-14 (Related art)
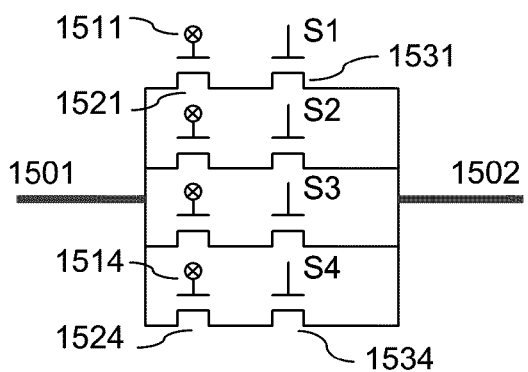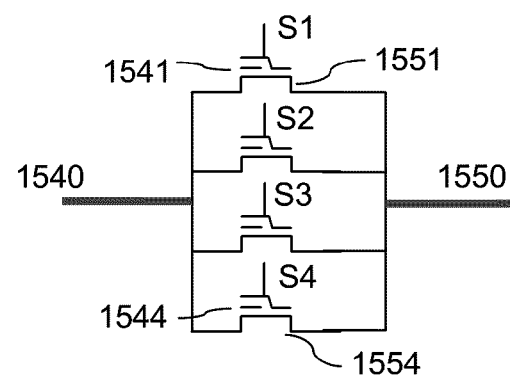
Fig-15A  Fig-15B

PROGRAMMABLE LOGIC DEVICES COMPRISING TIME MULTIPLEXED PROGRAMMABLE INTERCONNECT

This application is a division of application Ser. No. 11/369,541 filed on Mar. 8, 2006 now U.S. Pat. No. 7,486,111 which has as inventor Mr. R. U. Madurawe, the contents of which are incorporated herein by reference.

BACKGROUND

The present invention relates to programmable logic devices. Specifically it relates to programmable interconnect that can carry a plurality of input and output signals in a single wire, thus providing a significant reduction of interconnect required for programmable logic devices.

Traditionally, integrated circuit (IC) devices such as custom, semi-custom, or application specific integrated circuit (ASIC) devices have been used in electronic products to reduce cost, enhance performance or meet space constraints. However, the design and fabrication of custom or semi-custom ICs can be time consuming and expensive. The customization involves a lengthy design cycle during the product definition phase and high Non Recurring Engineering (NRE) costs during manufacturing phase. In the event of finding a logic error in the custom or semi-custom IC during final test phase, the design and fabrication cycle has to be repeated. Such lengthy correction cycles further aggravate the time to market and engineering cost. As a result, ASICs serve only specific applications and are custom built for high volume and low cost.

Another type of semi custom device called a Gate Array customizes modular blocks at a reduced NRE cost by synthesizing the design using a software model similar to the ASIC. Structured ASICs provide a larger modular block compared to Gate Arrays, and may or may not provide pre instituted clock networks to simplify the design effort. In both, a software tool has to undergo a tedious iteration between a trial placement and ensuing wire "RC" extraction for timing closure. The missing silicon level design verification in both results in multiple spins and lengthy design iterations, further exacerbating a quick design solution.

In recent years there has been a move away from custom or semi-custom ICs toward field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to improve silicon performance. The flexibility of this programmability is expensive in terms of silicon real estate, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late in the product design cycle. It is only for high volume production runs that there is a cost benefit in using the more traditional approaches. Compared to PLD and FPGA, an ASIC has hard-wired logic connections, identified during the chip design phase. ASIC has no multiple logic choices, no multiple routing choices and no configuration memory to customize logic and routing. This is a large chip area and cost saving for the ASIC. Smaller ASIC die sizes lead to better performance. A full custom ASIC also has customized logic functions which can take less gate counts compared to PLD and FPGA implementations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage). The cost of Silicon real estate for programmability provided by the PLD and FPGA compared to ASIC determines the extra cost the user has to bear for customer re-configurability of logic functions.

The ratio of FPGA to ASIC logic gate Silicon area can result as much as 30 to 40 times to implement identical content. Such a large Silicon area disadvantage lead to significant cost and performance disparity between the ASIC and the FPGA. A significant FPGA logic gate Silicon density improvement has been disclosed in the incorporated-by-reference application Ser. Nos. 10/267,483, 10/267,484 and 10/267,511. Such techniques can reduce the ratio of FPGA to ASIC logic gate Silicon area to 3 to 6 times. The most significant portion of Silicon real estate overhead is consumed by programmable interconnects in an FPGA. In a conventional FPGA, over 90% of the configuration memory is dedicated to customize routing for the user, while only under 10% of the configuration memory is utilized to customize logic. Reducing the FPGA logic area penalty to less than 2x would eliminate the need for ASIC designs, and the FPGA design will become the new standard for system design.

In an exact analogy between an FPGA and a City; the Houses in the City are equivalent to Logic in the FPGA, and the Roads in the City are equivalent to Routing Wires in the FPGA. Each Input and Output signal of a Logic Block in the FPGA is a dedicated Incoming and Outgoing Road to the House. Any network of Roads to customize a generic City with specific travel needs would be enormous: first all Houses have to be identified with the correct Incoming & Outgoing Roads, then the required Roads must be found within the network of Roads, and finally the travel times have to be computed to ensure that all meet the Travel Time budget. Not having enough Roads mandate taking detours that affect critical time budgets. Not having enough Red/Green lights and intersections in the network of Road affects the Road utilization efficiency & navigation. The challenge of an FPGA is similar: to provide a network of Roads that do not take up most of the City area, or to keep the FPGA area close to ASIC area.

In a PLD and an FPGA, a complex logic design is broken down to smaller logic blocks and programmed into logic blocks provided in the FPGA. Smaller logic elements allow sequential and combinational logic design implementations. Combinational logic has no memory and outputs reflect a function solely of present inputs. Sequential logic is implemented by inserting memory into the logic path to store past history. Current PLD and FPGA architectures include transistor pairs, NAND or OR gates, multiplexers, look-up-tables (LUTs) and AND-OR structures in a basic logic element. In a PLD the basic logic element is labeled as macro-cell. Hereafter the terminology FPGA will include both FPGAs and PLDs, and the terminology logic element will include both logic elements and macro-cells. Granularity of a FPGA refers to logic content of a basic logic element. Smaller blocks of a complex logic design are customized to fit into FPGA grain. In fine-grain architectures, a small basic logic element is enclosed in a routing matrix and replicated. This is like building one room track Houses in the City. These offer easy logic fitting at the expense of complex routing. In course-grain architectures, many basic logic elements are combined with local routing and wrapped in a routing matrix to form a logic block. This is like building repeating programmable neighborhoods in the City, each neighborhood providing some customization capability. The logic block is then replicated with global routing. Larger logic blocks make the logic fitting difficult and the routing easier. A challenge for FPGA architectures is to provide easy logic fitting (like fine-grain) and maintain easy routing (like course-grain). It's balancing the neighborhood size with the network of roads required.

Inputs and outputs for the Logic Element or Logic Block are selected from the programmable Routing Matrix. A routing wire is dedicated to each. An exemplary routing matrix containing logic elements described in Ref-1 (Seals & Whapshott) is shown in FIG. 1. In that example, the inputs and outputs from Logic Element 101-104 are routed to 22 horizontal and 12 vertical interconnect wires with programmable via connections. These connections may be anti-fuses or pass-gate transistors controlled by SRAM memory elements. These are the Red/Green control lights in the network of Roads comprising a Connect state and a Disconnect state. One output of element 101 is shown coupled to one of the inputs to element 104 in darker lines: in that vertical wire #3 is used to complete the coupling. One output of element 103 is also shown coupled to one of the inputs to element 104 in darker lines: in that vertical wire #8 is used to complete the coupling. Thus every input and every output occupies one or more dedicated wires to complete the coupling. Thus the number wires, wire segments, programmable connection, and Si area required for the connectivity grows rapidly with the number of logic elements N within the fabric.

The logic element having a built in D-flip-flop used with FIG. 1 routing as described in Ref-1 is shown in FIG. 2. In that, elements 201, 202 and 203 are 2:1 MUX's controlled by one input signal each. Element 204 is an OR gate while 205 is a D-Flip-Flop. Without global Preset & Clear signals, eight inputs feed the logic block, and one output leaves the logic block. These 9 wires are shown in FIG. 1 with programmable connectivity. Thus 9 wires must be assigned to connect the logic element shown in FIG. 2. All two-input, most 2-input and some 3-input variable functions are realized in the logic block and latched to the D-Flip-Flop. FPGA architectures for various commercially available devices are discussed in Ref-1 (Seals & Whapshott) as well as Ref-2 (Sharma). A comprehensive thesis on FPGA routing architecture is provides in Ref-3 (Betz, Rose & Marquardt) and Ref-4 (Lemieux & Lewis).

Routing block wire structure defines how logic blocks are connected to each other. Neighboring logic elements have short wire connections, while die opposite corner logic blocks have long wire connections, or a multiple of shorter wires connected to make a long wire. All wires are driven by a fixed pre-designed logic element output buffer and the drive strength does not change on account of wire length. Longer wires may have repeaters to rejuvenate the signals periodically. Buffers consume a large Si area and very expensive. The wire delays become unpredictable as the wire lengths are randomly chosen during the Logic Optimization to best fit the design into a given FPGA. FPGA's also incur lengthy run times during timing driven optimization of partitioned logic. As FPGA's grow bigger in die size, the number of wire segments and wire lengths to connect logic increase. Wire delays dominate chip performance. Wire delays grow proportional to square of the wire length, and inverse distance to neighboring wires. Maximum chip sizes remain constant at mask dimension of about 2 cm per side, while metal wire spacing is reduced with technology scaling. A good timing optimization requires in depth knowledge of the specific FPGA fitter, the length of wires segments, and relevant process parameters; a skill not found within the design house doing the fitting. In segmented wire architectures, expensive fixed buffers are provided to drive global signals on selected lines. These buffers are too few as they are too expensive, and only offer unidirectional data flow. Predictable timing is another challenge for FPGA's. This would enhance place and route tool capability in FPGA's to better fit and optimize timing critical logic designs. More wires exacerbate the problem, while fewer wires keep the problem tractable, reducing FPGA cost.

FPGA architectures are discussed in detail in the referenced US patents incorporated herein by reference. These patents disclose specialized routing blocks to connect logic elements in FPGA's and macro-cells in PLD's. In all cases a fixed routing block is programmed to define inputs and outputs for the logic blocks, while the logic block performs a specific logic function. Such dedicated interconnect wires drive the cost of FPGAs over equivalent functionality ASICs.

Four methods of programmable point to point connections, synonymous with programmable switches, between A and B are shown in FIG. 3. These are the equivalence of Red/Green signal lights in FPGAs. A configuration circuit (the method to decide and change Red vs. Green) to program the connection is not shown. All the patents listed above use one or more of these basic connections to configure logic elements and programmable interconnect. The user implements the decision by programming memory. In FIG. 3A, a conductive fuse link 310 connects A to B. It is normally connected, and passage of a high current or a laser beam will blow the conductor open. In FIG. 3B, a capacitive anti-fuse element 320 disconnects A to B. It is normally open, and passage of a high current will pop the insulator to short the terminals. Fuse and anti-fuse are both one time programmable due to the non-reversible nature of the change. In FIG. 3C, a pass-gate device 330 connects A to B. The gate signal $S_0$ determines the nature of the connection, on or off. This is a non destructive change. The gate signal is generated by manipulating logic signals, or by configuration circuits that include memory. The choice of memory varies from user to user. In FIG. 3D, a floating-pass-gate device 340 connects A to B. Control gate signal $S_0$ couples a portion of that to floating gate. Electrons trapped in the floating gate determines on or off state of the connection. Hot-electrons and Fowler-Nordheim tunneling are two mechanisms to inject charge onto floating-gates. When high quality insulators encapsulate the floating gate, trapped charge stays for over 10 years. These provide non-volatile memory. EPROM, EEPROM and Flash memory employ floating-gates and are non-volatile. Anti-fuse and SRAM based architectures are widely used in commercial FPGA's, while EPROM, EEPROM, anti-fuse and fuse links are widely used in commercial PLD's. Volatile SRAM memory needs no high programming voltages, is freely available in every logic process, is compatible with standard CMOS SRAM memory, lends to process and voltage scaling and has become the de-facto choice for modern very large FPGA devices.

A volatile six transistor SRAM based configuration circuit is shown in FIG. 4A. The SRAM memory element can be any one of 6-transistor, 5-transistor, full CMOS, R-load or TFT PMOS load based cells to name a few. Two inverters 403 and 404 connected back to back forms the memory element. This memory element is a latch. The latch can be full CMOS, R-load, PMOS load or any other. Power and ground terminals for the inverters are not shown in FIG. 4A. Access NMOS transistors 401 and 402, and access wires GA, GB, BL and BS provide the means to configure the memory element. Applying zero and one on BL and BS respectively, and raising GA and GB high enables writing zero into device 401 and one into device 402. The output $S_0$ delivers a logic one. Applying one and zero on BL and BS respectively, and raising GA and GB high enables writing one into device 401 and zero into device 402. The output $S_0$ delivers a logic zero. The SRAM construction may allow applying only a zero signal at BL or BS to write data into the latch. The SRAM cell may have only one access transistor 401 or 402. The SRAM latch will hold the data state as long as power is on. When the power is turned off, the SRAM bit needs to be restored to its previous state from an outside permanent memory. In the literature for programmable logic, this second non-volatile memory is also called configuration memory. The SRAM configuration circuit in FIG. 4A controlling logic pass-gate as shown in FIG. 3C is illustrated in FIG. 4Ba. Element 450 represents the configuration circuit. The $S_0$ output directly driven by the memory element in FIG. 4A drives the pass-gate gate electrode. In addition to $S_0$ output and the latch, power, ground, data in and write enable signals in 450 constitutes the SRAM configuration circuit. Write enable circuitry includes GA, GB, BL, BS signals shown in FIG. 4A. The symbol used for the programmable switch comprising the SRAM device and the pass-gate is shown in FIG. 4Bb as the cross-hatched circle 460. SRAM memory data can be changed anytime in the operation of the device, altering an application and routing on the fly, thus giving rise to the concept of reconfigurable computing in FPFA devices.

A programmable MUX utilizes a plurality of point to point switches. FIG. 5 shows three different MUX based programmable logic constructions. FIG. 5A shows a programmable 2:1 MUX. In the MUX, two pass-gates 511 and 512 allow two inputs $I_0$ and $I_1$ to be connected to output O. A configuration circuit 550 having two complementary output control signals $S_0$ and $S_0'$ provides the programmability. When $S_0=1$, $S_0'=0$; $I_0$ is coupled to O. When $S_0=0$, $S_0'=1$; $I_1$ is coupled to O. With one memory element inside 550, one input is always coupled to the output. If two bits were provided inside 550, two mutually exclusive outputs $S_0$ and $S_1$ could be generated. That would allow neither $I_0$ nor $I_1$ to be coupled to O, if such a requirement exists in the logic design. FIG. 5B shows a programmable 4:1 MUX controlled by 2 memory elements. A similar construction when the 4 inputs $I_0$ to $I_3$ are replaced by 4 memory element outputs $S_0$ to $S_3$, and the pass-gates are controlled by two inputs $I_0$ & $I_1$ is called a 4-input look up table (LUT). The 4:1 MUX in FIG. 5B operate with two memory elements 561 and 562 contained in the configuration circuit 560 (not shown). Similar to FIG. 5A, one of $I_0$, $I_1$, $I_2$ or $I_3$ is connected to O depending on the $S_0$ and $S_1$ states. For example, when $S_0=1$, $S_1=1$, $I_0$ is coupled to O. Similarly, when $S_0=0$ and $S_1=0$, $I_3$ is coupled to O. A 3 bit programmable 3:1 MUX is shown in FIG. 5C. Point D can be connected to A, B or C via pass-gates 531, 533 or 532 respectively. Memory elements 571, 572 and 573 contained in a configuration circuit 570 (not shown) control these pass-gate input signals. Three memory elements are required to connect D to just one, any two or all three points. In reconfigurable computing, data in memory elements 571, 572 and 573 can be changed on the fly to alter connectivity between A, B, C and D as desired.

In FPGA's the configuration memory content is very high. It is typically loaded when the device is powered up, and takes up a considerable time to fully load all the data. On the fly alteration of memory is extremely cumbersome. References U.S. Pat. Nos. 5,629,637 and 6,480,954 disclose some methods to make the task manageable. The problem has now grown three fold: (i) Dedicated wires were needed to connect the inputs and outputs leading to a large chip area, (ii) Extra circuitry is inserted to identify which portion of the memory data is refreshed further adding to the cost of the device, and (iii) The operation must be halted to upgrade the memory with new data leading to significant switch-over dead time. Efficient software tools that can synthesize designs into a multitude of variable designs do not exist even in these modern days. Reconfigurable computing does not resolve the high cost of FPGAs over ASICs.

What is desirable is to reduce the Silicon overhead required to support routing wires within a programmable logic device. The routing must provide timing predictability and easily integrated into a software tool. These routing connections need to facilitate short wire connections and long wire connections and then preserve timing in a predictable and calculable manner. One method to reduce the wire overhead is to provide a programmable time multiplexing scheme to share one wire with a plurality of inputs/outputs, thus reducing the overall wires needed within the FPGA. It is also beneficial to have the ability to program the data flow direction, and have the entire configurability integrated into vertical configuration circuits. Vertically integrated configuration circuits in 3D FPGAs, previously presented and incorporated herein, provide significant cost reductions and performance improvement to FPGAs. Previously presented techniques incorporated herein to use bi-directional buffers and highly efficient bridge structures all consume less Si real estate to further reduce the cost of FPGAs. The new interconnect structure must reach reasonable cost parity to ASICs (within 2× of ASIC cost) and also lend to an easy application specific design conversion to the user, preserving the original timing characteristics of the circuit during the conversion.

SUMMARY

In one aspect, a programmable logic device, wherein a plurality of outputs from logic blocks is coupled to a plurality of inputs to logic blocks by a single wire segment comprising a programmable time multiplexing method.

Implementations of the above aspect may include one or more of the following. A programmable logic device comprises an array of structured programmable logic cells or logic modules. These modules may use one or more metal layers to partially connect them. These modules may be customized by the user for specific logic functions. A programmable interconnect structure may be used to fully customize a specific interconnect pattern by the user to interconnect the customized logic modules. Said interconnect structure is formed above said structured cell array. The programmable structure may include one or more upper metal layers. These metal layers provide the interconnect structure to complete the functionality of the integrated circuit and form connections to input and output pads. Said interconnect structure comprises a programmable switch. Most common switch is a pass-gate device. A pass-gate is an NMOS transistor, a PMOS transistor or a CMOS transistor pair that can electrically connect two points. A pass-gate is a conductivity modulating element that comprises a connect state and a disconnect state. Other methods of connecting two points include fuse links and anti-fuse capacitors. Yet other methods to connect two points may include an electrochemical or ferroelectric or other cell. Programming these devices include forming one of either a conducting path or a non-conducting path.

The gate electrode signal on said pass-gates allows a programmable method of controlling an on and off connection. A plurality of pass-gate logic is included in said programmable logic blocks and programmable wire structure. The structure may include circuits consisting of CMOS transistors comprising AND, NAND, INVERT, OR, NOR, Look-Up-Table, Truth-Table, MUX, Arithmetic-Logic-Unit, Central-Processor-Unit, Programmable-Memory and Pass-Gate type logic circuits. Multiple logic circuits may be combined into a larger logic block. Configuration circuits are used to offer programmability. Configuration circuits have memory elements and access circuitry to change memory data. Each memory element can be a transistor or a diode or a group of electronic devices. The memory elements can be made of CMOS devices, capacitors, diodes, resistors and other electronic components. The memory elements can be made of thin film devices such as thin film transistors (TFT), thin-film capacitors and thin-film diodes. The memory element can be selected from the group consisting of volatile and non volatile memory elements. The memory element can also be selected from the group comprising fuses, antifuses, SRAM cells, DRAM cells, optical cells, metal optional links, EPROMs, EEPROMs, flash, magnetic and ferro-electric elements. Memory element can be a conductivity modulating element. One or more redundant memory elements can be provided for controlling the same circuit block. The memory element can generate an output signal to control pass-gate logic. Memory element can generate a signal that is used to derive a control signal. The control signal is coupled to pass-gate logic element, AND array, NOR array, a MUX or a Look-Up-Table (LUT) logic.

Logic blocks comprise outputs and inputs. Logic functions perform logical operations. Logic functions manipulate input signals to provide a required response at one or more outputs. The input signals may be stored in storage elements. The output signals may be stored in storage elements. The input and output signals may be synchronous or asynchronous signals. The inputs of logic functions may be received from memory, or from input pins on the device, or from outputs of other logic blocks in the device. The outputs of logic blocks may be coupled to other inputs, or storage devices, or to output pads in the device, or used as control logic.

Structured cells are fabricated using a basic logic process capable of making CMOS transistors. These transistors are formed on P-type, N-type, epi or SOI substrate wafer. Configuration circuits, including configuration memory, constructed on same silicon substrate take up a large Silicon foot print. That adds to the cost of programmable wire structure compared to a similar functionality custom wire structure. A 3-dimensional integration of pass-gate and configuration circuits to connect wires provides a significant cost reduction in the incorporated-by-reference applications. The pass-gates and configuration circuits may be constructed above one or more metal layers. Said metal layers may be used for intra and inter connection of structured cells. The programmable wire circuits may be formed above the structured cell circuits by inserting a thin-film transistor (TFT) module or a laser-fuse model, or any other vertical memory structure. Said memory module may be inserted at any via layer, in-between two metal layers or at the top of top metal layer of a logic process. The memory element can generate an output signal to control logic gates. Memory element can generate a signal that is used to derive a control signal.

The programmable interconnect comprises a significant overhead in a FPGA/PLD. In generic FPGA devices commercialized today, over 90% of the configurability is towards programming interconnect while 10% is to configure logic. Unidirectional wires with periodic repeaters are a common practice. In incorporated-by-reference applications bi-directional wires were disclosed to provide significant overhead reduction to interconnect. All interconnect in FPGAs are dedicated between one output and one input. In one embodiment, a plurality of outputs and a plurality of inputs may share one wire. Control signals may provide a time-multiplexing arrangement to regulate time slots between the outputs and the inputs. The control signals may be non-overlapping clocks, each clock directing one output to couple to one input. To time-multiplex signals, output wire structures may require special construction. In a first embodiment a time multiplexed wire structure in an integrated circuit, comprising: a first wire and a second wire; and two or more paths to couple the first wire to the second wire, wherein each coupling path is further comprised of: a programmable means to select or deselect the path; and a pass-gate activated by a control signal to couple or decouple the first wire to said second wire; wherein, a selected path couples the first wire to the second wire during a time period when the control signal to the pass-gate in said path is asserted to a first state. In a second embodiment a time multiplexed wire structure in an integrated circuit, comprising: a first set of wires and a second wire, wherein each of the first set of wires comprises two or more paths to couple said set wire to the second wire, wherein each coupling path is further comprised of: a programmable means to select or deselect the path; and a pass-gate activated by a control signal to couple or decouple the set wire to said second wire; wherein, a selected path couples the set wire to the second wire during a time period when the control signal to the pass-gate in said path is asserted to a first state; and wherein, each of the control signals is common to the pass-gate in one path between each of the first set of wires and the second wire.

Inputs may also be modified to time multiplex wires. In one embodiment a time multiplexed wire structure in an integrated circuit, comprising: a first wire and a set of wires, said first wire comprising a signal state; and a plurality of paths, each path coupling the first wire to two of the set of wires, each said path further comprising: a pass-gate coupled to the first wire, said pass-gate activated by a control signal to select or deselect the path; and a storage device coupled to the pass-gate, wherein when the pass-gate is activated, the storage device couples to the first wire and stores the signal state of the first wire, said storage device further coupled to said two set wires providing the stored signal state and the complement of the signal state to said two set wires; wherein, each path couples the first wire to the data storage device in the path during a time period when the control signal to the pass-gate in said path is asserted to a first state; and wherein, the data storage unit provides the stored signal level and the compliment of the signal level to the two of the set of wires. Such inputs and outputs significantly reduce the overall wires requires in an FPGA interconnect structure.

In a second aspect, a software placement and route tool, wherein a plurality of routs is assigned to a single route, wherein the plurality of routs is routed in the single route by a time multiplexed method.

Implementations of the above aspect may include one or more of the following. A typical placement and route (P&R) tool assigns a single route from an output to input. These routes handle a dedicated coupling between the two nodes. In a first embodiment, the software tool may group all the inputs of a logic block in one location. The tool then identifies all outputs in preceding logic blocks that generate the inputs, and assign a single route to couple the plurality of outputs to the plurality of inputs. The tool may then identify the set of common non-overlapping control clock signals and select matching time slots to couple the required outputs to required inputs in a sequential manner. The software tool may further optimize the performance by adjusting the critical signal coupling to the global system clock to achieve the best performance. In another embodiment, a pair of wires may be assigned to couple a plurality of outputs to a plurality of inputs. A differential signal level may couple the outputs to inputs at a clock rate far exceeding the system clock. In one example the internal time-multiplexing rate may be 10 GHz, while the system clock is only 1 GHz. The differential time multiplexing may also save a considerable power in the device due to the very low voltage swings encountered by the wires.

In a third aspect, a critical signal propagation path in a programmable logic device comprising global non-overlapping control signals and time multiplexed wires, wherein each control signal assigns a programmable time slot for multiple signals within one of said wires, further comprising one or more critical signals assigned to the last multiplexed time slot.

Implementations of the above aspect may further include one or more of the following. A time multiplexing hurts timing as all signals have to stabilize before a valid result is achieved. In a multi-input function, some inputs may be more critical than others. In one embodiment, the outputs and the inputs both have many non-overlapping control signals to pick a matching time slot. The most critical signal may be assigned the time slot that provides the optimal time to the system clock that determines the critical path delay. In one case, this may be the last time slot in the relay cycle. In another case, this may be related to the availability of the outputs: the early output is given the first time slot, while the last ready output is assigned the last time slot. In yet another case, the control signals may comprise a programmable delay element at the input sites. The outputs may relay data prior to the inputs receiving the data. Said inputs may react to a delayed control signal from the transmitting control signal. This delay may vary to account for the wire delay between the two nodes.

Implementations of the above aspects may include one or more of the following. A routing structure may comprise a significant reduction in the bi-directional segmented wires in a PLD/FPGA. Bundles of wires terminating at a switch block may have more efficient and less area consuming bridges structures. Special bridge structures for FPGAs were disclosed in incorporated-by-reference applications. Such time-multiplexed interconnect constitutes low cost fabrication of a VLSI IC product. The IC product is re-programmable in its initial stage with turnkey conversion to an ASIC. The IC has the end ASIC cost structure and FPGA re-programmability. The IC product offering occurs in two phases: the first stage is a generic FPGA that has re-programmability containing a programmable module, and the second stage is an ASIC with the entire programmable module replaced by 1 to 2 customized hard-wire masks.

A series product families can be provided with a modularized programmable element in an FPGA version followed by a turnkey custom ASIC with the same base die with 1-2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASIC's in cost and performance.

An easy turnkey customization of an ASIC from an original smaller cheaper and faster PLD or FPGA would greatly enhance time to market, performance, and product reliability.

BRIEF DESCRIPTION OF THE DRAWINGS

FIG. 3A shows an exemplary fuse link point to point connection.

FIG. 3B shows an exemplary anti-fuse point to point connection.

FIG. 3C shows an exemplary pass-gate point to point connection.

FIG. 3D shows an exemplary floating-pass-gate point to point connection.

FIG. 4A shows an exemplary configuration circuit for a 6T SRAM element.

FIG. 4Ba shows an exemplary programmable pass-gate switch with SRAM memory.

FIG. 4Bb shows the symbol used for switch in FIG. 4Ba.

FIG. 5A shows an exemplary 2:1 MUX controlled by one bit.

FIG. 5B shows an exemplary 4:1 MUX controlled by 2 bits.

FIG. 5C shows an exemplary 3:1 MUX controlled by 3 bits.

FIG. 6 shows a configuration circuit utilizing anti-fuse memory elements.

FIG. 7 shows a first embodiment of a configuration circuit utilizing a floating-gate.

FIG. 10 shows a 3-dimensional construction of a programmable device.

FIG. 11A shows a hard-wire mapping for a programmable pass-gate.

FIG. 11B shows a hard-wire mapping for a programmable 2:1 MUX.

FIG. 13A shows a programmable pass-gate with TFT SRAM memory element.

FIG. 13B shows the symbol for a TFT memory based programmable pass-gate.

FIG. 13C shows a 4×4 array of TFT memory based programmable pass-gate matrix.

FIG. 14 shows a 4×4 array of TFT memory based programmable pass-gate matrix.

FIG. 15A shows a first construction of a 4-time slot time-multiplexing wire structure.

FIG. 15B shows a second construction of a 4-time slot time-multiplexing wire structure.

DESCRIPTION

Figure 1:
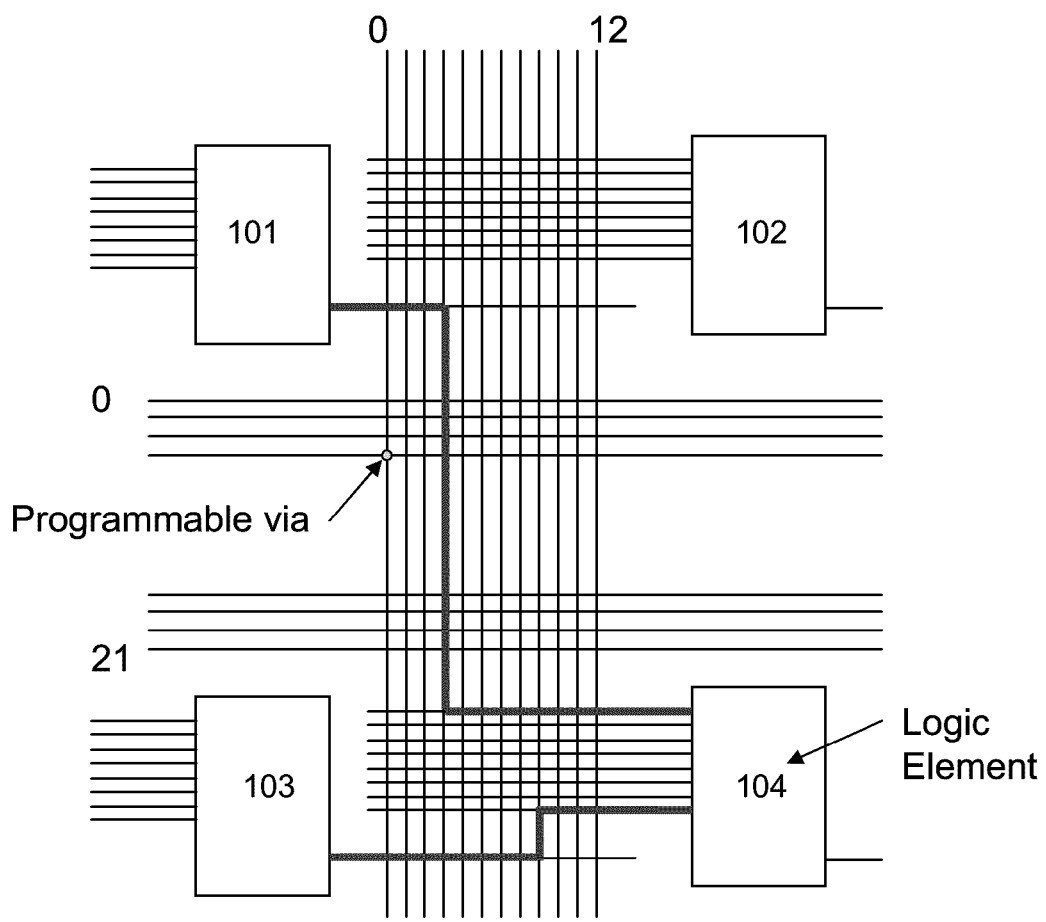
FIG. 1 shows an exemplary interconnect structure utilizing a logic element.
Figure 2:
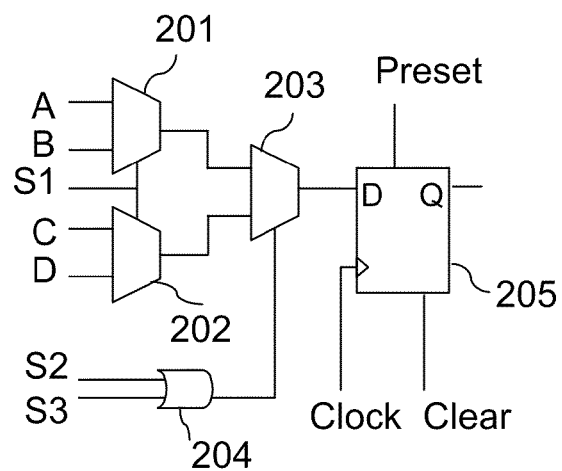
FIG. 2 shows an exemplary logic element.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

DEFINITIONS

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors.

The term module layer includes a structure that is fabricated using a series of predetermined process steps. The boundary of the structure is defined by a first step, one or more intermediate steps, and a final step. The resulting structure is formed on a substrate.

The term pass-gate and switch refers to a structure that can pass a signal when on, and block signal passage when off. A pass-gate connects two points when on, and disconnects two points when off. A pass-gate can be a floating-gate transistor, an NMOS transistor, a PMOS transistor or a CMOS transistor pair. The gate electrode of transistors determines the state of the connection. A CMOS pass-gate requires complementary signals coupled to NMOS and PMOS gate electrodes. A control logic signal is connected to gate electrode of a transistor for programmable logic. A pass-gate can be a conductivity modulating element. The conductivity may be made to change between a sufficiently conductive state to a sufficiently nonconductive state by a configuration means. The configurable element may comprise a chemical, magnetic, electrical, optical, ferro-electric or any other property that allow the element to change its conductivity between said two states.

The term buffer includes a structure that receives a weak incoming signal and transmits a strong output signal. Buffers provide high drive current to maintain signal integrity. Buffer includes repeaters that rejuvenate signal integrity in long wires. Buffer further includes a single inverter, and a series of connected inverters wherein each inverter in the series is sized larger to provide a higher drive current.

The term bridge includes a structure that manages routing within a set or a cluster of wires. Signals arriving at the bridge on a wire may be transmitted to one or more other wires in that bridge. A bridge includes simple transmission, buffered transmission, uni-directional or multi-directional routing on the wire cluster. A bridge includes switch blocks.

The term configuration circuit includes one or more configurable elements and connections that can be programmed for controlling one or more circuit blocks in accordance with a predetermined user-desired functionality. The configuration circuit includes the memory element and the access circuitry, herewith called memory circuitry, to modify said memory element. Configuration circuit does not include the logic pass-gate controlled by said memory element. In one embodiment, the configuration circuit includes a plurality of memory circuits to store instructions to configure an FPGA. In another embodiment, the configuration circuit includes a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term time-multiplexing includes the ability to differentiate a value in time domain. The value may be a voltage, a signal or any electrical property in an IC. A plurality of time intervals make a valid time period. Inside the time period, a value comprises a plurality of valid states: each state attributed to each time interval within the period. Thus time-multiplexing provides a means to identify a plurality of valid values within a time period.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense.

A point to point connection can be made utilizing programmable pass-gate logic as shown in FIG. 3C and FIG. 3D. Multiple inputs (node A) can be connected to multiple outputs (node B) with a plurality of pass-gate logic elements. An SRAM base connection is shown in FIG. 4, where pass-gate 430 can be a PMOS or an NMOS transistor. NMOS is preferred due to its higher conduction. The gate voltage $S_0$ on NMOS transistor 410 gate electrode determines an ON or OFF connection. That logic level is generated by a configuration circuit 450 coupled to the gate of NMOS transistor 410. The pass-gate logic connection requires the configuration circuitry to generate signal $S_0$ with sufficient voltage levels to ensure off and on conditions. For an NMOS pass-gate, $S_0$ having a logic level one completes the point to point connection, while a logic level zero keeps them disconnected. In addition to using only an NMOS gate, a PMOS gate could also be used in parallel to make the connection. The configuration circuit 450 needs to then provide complementary outputs ($S_0$ and $S_0'$) to drive NMOS and PMOS gates in the connection. Configuration circuit 450 contains a memory element. Most CMOS SRAM memory delivers complementary outputs. This memory element can be configured by the user to select the polarity of $S_0$, thereby selecting the status of the connection. The memory element can be volatile or non-volatile. In volatile memory, it could be DRAM, SRAM, Optical or any other type of a memory device that can output a valid signal $S_0$. In non-volatile memory it could be fuse, anti-fuse, EPROM, EEPROM, Flash, Ferro-Electric, Magnetic or any other kind of memory device that can output a valid signal $S_0$. The output $S_0$ can be a direct output coupled to the memory element, or a derived output in the configuration circuitry. An inverter can be used to restore $S_0$ signal level to full rail voltage levels. The SRAM in configuration circuit 450 can be operated at an elevated Vcc level to output an elevated $S_0$ voltage level. This is especially feasible when the SRAM is built in a separate TFT module. Other configuration circuits to generate a valid $S_0$ signal are discussed next.

An anti-fuse based configuration circuit to use with this invention is shown next in FIG. 6. Configuration circuit 450 in FIG. 4B can be replaced with the anti-fuse circuit shown in FIG. 6. In FIG. 6, output level $S_0$ is generated from node X which is coupled to signals VA and VB via two anti-fuses 650 and 660 respectively. Node X is connected to a programming access transistor 670 controlled by gate signal GA and drain signal BL. A very high programming voltage is needed to blow the anti-fuse capacitor. This programming voltage level is determined by the anti-fuse properties, including the dielectric thickness. Asserting signal VA very high, VB low (typically ground), BL low and GA high (Vcc to pass the ground signal) provides a current path from VA to BL through the on transistor 670. A high voltage is applied across anti-fuse 650 to pop the dielectric and short the terminals. Similarly anti-fuse 660 can be programmed by selecting VA low, VB very high, BL low and GA high. Only one of the two anti-fuses is blown to form a short. When the programming is done, BL and GA are returned to zero, isolating node X from the programming path. VA=Vss (ground) and VB=Vcc (power, or elevated Vcc) is applied to the two signal lines. Depending on the blown fuse, signal $S_0$ will generate a logic low or a logic high signal. This is a one time programmable memory device. Node X will be always connected to VA or VB by the blown fuse regardless of the device power status. Signals GA and BL are constructed orthogonally to facilitate row and column based decoding to construct these memory elements in an array.

Figure 8:
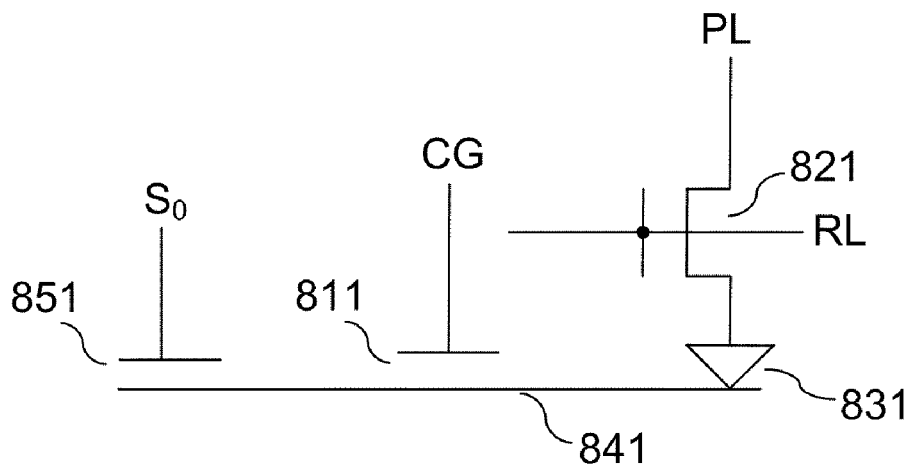
FIG. 8 shows a second embodiment of a configuration circuit utilizing a floating-gate.

FIGS. 7 & 8 shows two EEPROM non-volatile configuration circuits that can be used in this invention. Configuration circuit 450 in FIG. 4B can be replaced with either of two EEPROM circuit shown in FIG. 7 and FIG. 8. In FIG. 7, node 740 is a floating gate. This is usually a poly-silicon film isolated by an insulator all around. It is coupled to the source end of programming transistor 720 via a tunneling diode 730. The tunneling diode is a thin dielectric capacitor between floating poly and substrate silicon with high doping on either side. When a large programming (or erase) voltage Vpp is applied across the thin dielectric, a Fowler-Nordheim tunneling current flows through the oxide. The tunneling electrons move from electrical negative to electrical positive voltage. Choosing the polarity of the applied voltage across the tunneling dielectric, the direction of electron flow can be reversed. Multiple programming and erase cycles are possible for these memory elements. As the tunneling currents are small, the high programming voltage (Vpp) can be generated on chip, and the programming and erasure can be done while the chip is in a system. It is hence called in system programmable (ISP). An oxide or dielectric capacitor 710 couples the floating gate (FG) 740 to a control gate (CG). The control gate CG can be a heavily doped silicon substrate plate or a second poly-silicon plate above the floating poly. The dielectric can be oxide, nitride, ONO or any other insulating material. A voltage applied to CG will be capacitively coupled to FG node 740. The coupling ratio is designed such that 60-80 percent of CG voltage will be coupled to FG node 740. To program this memory element, a negative charge must be trapped on the FG 740. This is done by applying positive Vpp voltage on CG, ground voltage on PL and a sufficiently high (Vcc) voltage on RL. CG couples a high positive voltage onto FG 740 creating a high voltage drop across diode 730. Electrons move to the FG 740 to reduce this electric field. When the memory device is returned to normal voltages, a net negative voltage remains trapped on the FG 740. To erase the memory element, the electrons must be removed from the floating gate. This can be done by UV light, but an electrical method is more easily adapted. The CG is grounded, a very high voltage (Vpp+ more to prevent a threshold voltage drop across 720) is applied to RL, and a very high voltage (Vpp) is applied to PL. Now a low voltage is coupled to FG with a very high positive voltage on the source side of device 720. Diode 730 tunneling removes electrons from FG. This removal continues beyond a charge neutral state for the isolated FG. When the memory device is returned to normal voltages, a net positive voltage remains trapped on the FG 740. Under normal operation RL is grounded to isolate the memory element from the programming path, and PL is grounded. A positive intermediate voltage Vcg is applied to CG terminal. FG voltage is denoted $S_0$. Under CG bias, $S_0$ signal levels are designed to activate pass-gate logic correctly. Configuration circuit in FIG. 8 is only different to that in FIG. 7 by the capacitor 851 used to induce $S_0$ voltage. This is useful when $S_0$ output is applied to leaky pass-gates, or low level leakage nodes. As gate oxide thicknesses reach below 50 angstroms, the pass-gates leak due to direct tunneling.

Figure 9:
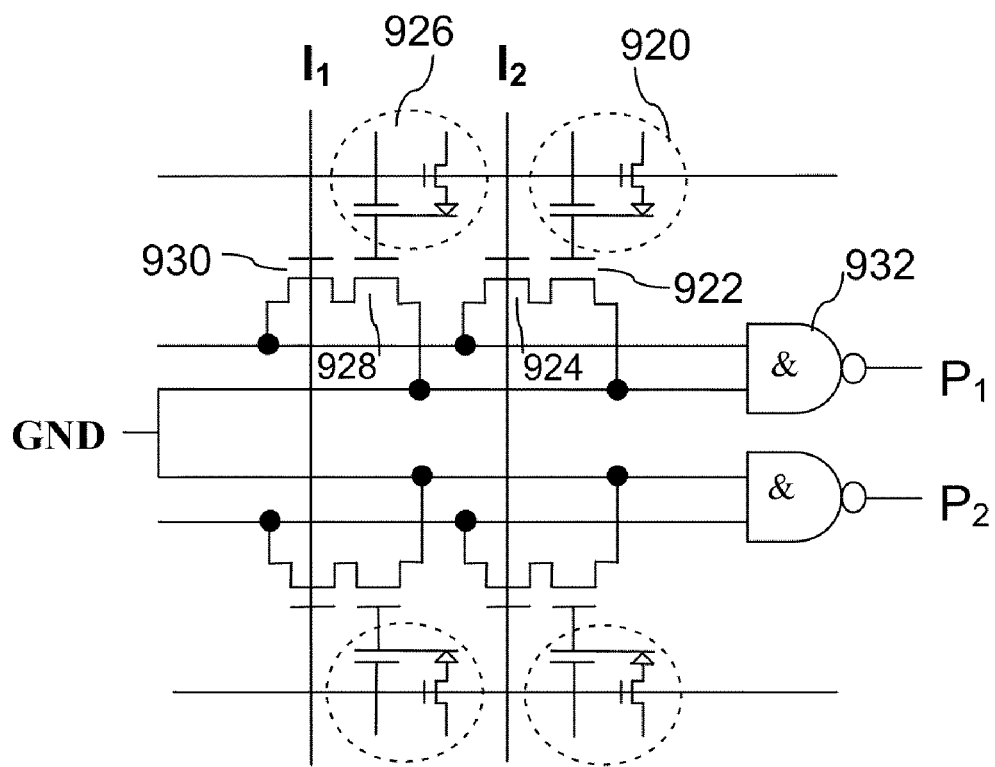
FIG. 9 shows a programmable AND array realization of floating-gate based memory elements.

These configuration circuits, and similarly constructed other configuration circuits, can be used in programmable logic devices. Those with ordinary skill in the art may recognize other methods for constructing configuration circuits to generate a valid $S_0$ output. FIG. 9 shows an EEPROM non-volatile memory element in the implementation of a Product-Term, also known as P-Term, in NAND-NOR logic. FIG. 9 shows two mirrored P-Term outputs P1 and P2. For output P1, an NAND gate 932 comprised of a pull-up device receives signals from pull down pass transistors 922, 924, 928 and 930. The pass transistor 922 is controlled by block 920 shown in the dashed circle, while the pass transistor 928 is controlled by a similar block 926 shown inside the dashed circle. These blocks 920 and 926 show the configuration circuits shown in FIG. 8A. Blocks 920 and 926 can be replaced by any one of configuration circuits shown in FIG. 4A, FIG. 7 or FIG. 8B to realize this logic function. Pass transistors 922, 924, 928, 930 and the NAND gate 932 show the logic block of the PLD. The logic block is not affected by the choice of the configuration circuit. This voltage output level applied to the gate of device 922 is designed to turn the device off or on at a designed control gate (CG) operating voltage.

SRAM memory technology has the advantage of not requiring a high voltage to configure memory. The SRAM based switch shown in FIG. 4B containing the SRAM memory circuit shown in FIG. 4A utilizes 6 extra configuration transistors, discounting the pass-gate 410, to provide the programmability. That is a significant overhead compared to application specific circuits where the point to point connection can be directly made with metal. Similarly other programmable memory elements capable of configuring pass-gate logic also carry a high silicon foot print. A cheaper method of constructing a vertically integrated SRAM cell is described in application Ser. No. 10/413,810 now U.S. Pat. No. 6,828,689 entitled "Semiconductor Latches and SRAM Devices", filed on Apr. 14, 2003 and list as inventor Mr. R. U. Madurawe, the contents of which are incorporated herein by reference. In a preferred embodiment, the configuration circuit is built on thin-film semiconductor layers located vertically above the logic circuits. The SRAM memory element, a thin-film transistor (TFT) CMOS latch as shown in FIG. 4A, comprises two lower performance back to back inverters formed on two semiconductor thin film layers, substantially different from a first semiconductor single crystal substrate layer and a gate poly layer used for logic transistor construction. This latch is stacked above the logic circuits for slow memory applications with no penalty on Silicon area and cost. This latch is adapted to receive power and ground voltages in addition to configuration signals. The two programming access transistors for the TFT latch are also formed on thin-film layers. Thus in FIG. 4B, all six configuration transistors shown in 450 are constructed in TFT layers, vertically above the pass transistor 410. Transistor 410 is in the conducting path of the connection and needs to be a high performance single crystal Silicon transistor. This vertical integration makes it economically feasible to add an SRAM based configuration circuit at a very small cost overhead to create a programmable solution. Such vertical integration can be extended to all other memory elements that can be vertically integrated above logic circuits.

A new kind of a programmable logic device utilizing thin-film transistor configurable circuits is disclosed in application Ser. No. 10/267,483 entitled "Three Dimensional Integrated Circuits", application Ser. No. 10/267,484 entitled "Methods for Fabricating Three-Dimensional Integrated Circuits", and application Ser. No. 10/267,511 now U.S. Pat. No. 6,747,478 entitled "Field Programmable Gate Array With Convertibility to Application Specific Integrated Circuit", all of which were filed on Oct. 8, 2002 and list as inventor Mr. R. U. Madurawe, the contents of which are incorporated-by-reference. The disclosures describe a programmable logic device and an application specific device fabrication from the same base Silicon die. The PLD is fabricated with a programmable memory module, while the ASIC is fabricated with a conductive pattern in lieu of the memory. Both memory module and conductive pattern provide identical control of logic circuits. For each set of memory bit patterns, there is a unique conductive pattern to achieve the same logic functionality. The vertical integration of the configuration circuit leads to a significant cost reduction for the PLD, and the elimination of TFT memory for the ASIC allows an additional cost reduction for the user. The TFT vertical memory integration scheme is briefly described next.

FIG. 10 shows an implementation of vertically integrated circuits, where the configuration memory element is located above logic. The memory element can be any one of fuse links, anti-fuse capacitors, SRAM cells, DRAM cells, metal optional links, EPROM cells, EEPROM cells, flash cells, ferro-electric elements, optical elements and magnetic elements that lend to this implementation. SRAM memory is used herein to illustrate the scheme and is not to be taken in a limiting sense. First, silicon transistors 1050 are deposited on a substrate. A module layer of removable SRAM cells 1052 are positioned above the silicon transistors 1050, and a module layer of interconnect wiring or routing circuit 1054 is formed above the removable memory cells 1052. To allow this replacement, the design adheres to a hierarchical layout structure. As shown in FIG. 10, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the top most module layer satisfying the same device and routing constraints. This description is equally applicable to any other configuration memory element, and not limited to SRAM cells.

Fabrication of the IC also follows a modularized device formation. Formation of transistors 1050 and routing 1054 is by utilizing a standard logic process flow used in the ASIC fabrication. Extra processing steps used for memory element 1052 formation are inserted into the logic flow after circuit layer 1050 is constructed. A full disclosure of the vertical integration of the TFT module using extra masks and extra processing is in the incorporated by reference applications discussed above.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user. A full disclosure of the ASIC migration from the original FPGA is in the incorporated by reference applications discussed above.

The ASIC migration path for the point to point connection in FIG. 4B and the 2:1 MUX in FIG. 5A are illustrated in FIG. 11A and FIG. 11B respectively. In FIG. 11A, the gate input signal to pass-gate 1110 is mapped to two possible conductive pattern connections: connection 1130 to Vss and connection 1140 to Vcc. The connections are made in metal or contacts between metal during the fabrication process. Based on the $S_0$ output state being 0 or 1 of a memory pattern to map into a conductive pattern, either Vss or the Vcc connection is chosen. For each memory bit state, only one conductive pattern connection is made. Similarly in FIG. 11B, pass-gate 1101 has conductive pattern options to Vss and Vcc at nodes 1131 and 1141 respectively. Pass-gate 1102 has conductive pattern options to Vss and Vcc at nodes 1132 and 1142 respectively. Neither or one of $I_0$ and $I_1$ can be connected to O from this option. Comparing FIG. 4A with FIG. 11A and FIG. 9A with FIG. 11B, the point to point connection is identical between the two configuration options: memory element and conductive pattern. The signal delay through these pass-gate connections also remains identical, independent of the control option. Timing characteristics of complex designs utilizing a plurality of these switches also stay intact during the conversion.

In a second embodiment for the conductive pattern, the pass-gate 1110 drain is shorted to source in FIG. 11A by a metal wire when $S_0=1$. Wire resistance is reduced by eliminating pass-gate 1110 ON resistance from the signal path. When $S_0=0$, the pass-gate is left connected to Vss to eliminate floating nodes. The signal delay will be altered between the conducting pattern and memory options. That change can be emulated in the FPGA by raising only SRAM memory Vcc, raising $S_0$ voltage to reduce 1110 ON resistance. As the FPGA is not meant for manufacturing under this scenario, time dependant die electric breakdown (TDDB) driven reliability is not an issue. This may be desirable to users who need higher performance tweak for the ASIC and field test the tweak for no other timing violations prior to conversion.

In FIG. 10, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed in the second plane to store instructions to control a portion of the circuit blocks.

The fabrication of thin-film transistors to construct configuration circuits is discussed next. A full disclosure is provided in application Ser. No. 10/413,809 entitled "Semiconductor Switching Devices", filed on Apr. 14, 2003, which lists as inventor Mr. R. U. Madurawe, the contents of which are incorporated herein by reference.

Figure 12:
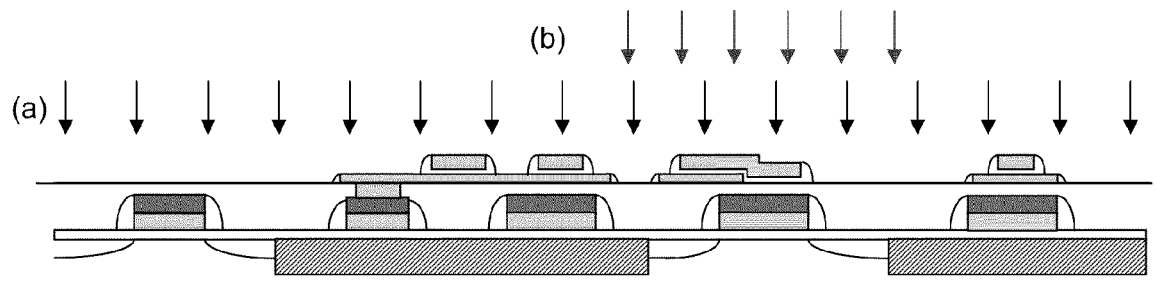
FIG. 12 shows constructional process cross sections of a TFT process.
Figure 12:
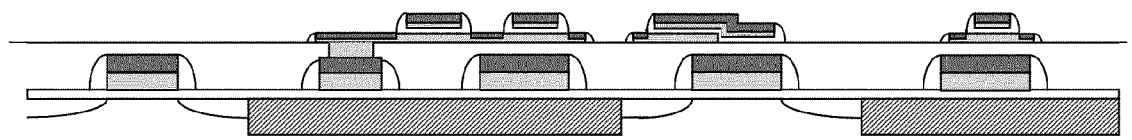
Figure 12:
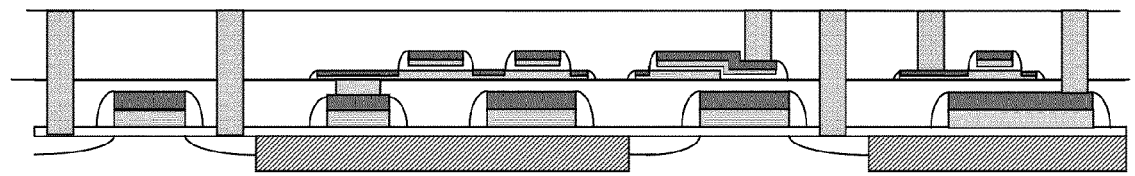

The following terms used herein are acronyms associated with certain manufacturing processes. The acronyms and their abbreviations are as follows:

$V_T$ Threshold voltage
LDN Lightly doped NMOS drain
LDP Lightly doped PMOS drain
LDD Lightly doped drain
RTA Rapid thermal annealing
Ni Nickel
Ti Titanium
TiN Titanium-Nitride
W Tungsten
S Source
D Drain
G Gate
ILD Inter layer dielectric
C1 Contact-1
M1 Metal-1
P1 Poly-1
P− Positive light dopant (Boron species, $BF_2$)
N− Negative light dopant (Phosphorous, Arsenic)
P+ Positive high dopant (Boron species, $BF_2$)
N+ Negative high dopant (Phosphorous, Arsenic)
Gox Gate oxide
C2 Contact-2
LPCVD Low pressure chemical vapor deposition
CVD Chemical vapor deposition
ONO Oxide-nitride-oxide
LTO Low temperature oxide A logic process is used to fabricate CMOS devices on a substrate layer for the fabrication of storage circuits. These CMOS devices may be used to build AND gates, OR gates, inverters, adders, multipliers, memory and pass-gate based logic functions in an integrated circuit. A CMOSFET TFT module layer or a Complementary gated FET (CGated-FET) TFT module layer may be inserted to a logic process at a first contact mask to build a second set of TFT MOSFET or Gated-FET devices. Configuration circuitry is build with these second set of transistors. An exemplary logic process may include one or more following steps:

P-type substrate starting wafer
Shallow Trench isolation: Trench Etch, Trench Fill and CMP
Sacrificial oxide
PMOS $V_T$ mask & implant
NMOS $V_T$ mask & implant
Pwell implant mask and implant through field
Nwell implant mask and implant through field
Dopant activation and anneal
Sacrificial oxide etch
Gate oxidation/Dual gate oxide option
Gate poly (GP) deposition
GP mask & etch
LDN mask & implant
LDP mask & implant
Spacer oxide deposition & spacer etch
N+ mask and NMOS N+ G, S, D implant
P+ mask and PMOS P+ G, S, D implant
Ni deposition
RTA anneal—Ni salicidation (S/D/G regions & interconnect)
Unreacted Ni etch
ILD oxide deposition & CMP FIG. 12 shows an exemplary process for fabricating a thin film MOSFET latch in a module layer. In one embodiment the process in FIG. 12 forms the latch in a layer substantially above the substrate layer. The processing sequence in FIG. 12.1 through 12.7 describes the physical construction of a MOSFET device for storage circuits 450 shown in FIG. 4B. The process of FIG. 12 includes adding one or more following steps to the logic process after ILD oxide CMP step.

C1 mask & etch
W-Silicide plug fill & CMP
~300 A poly P1 (crystalline poly-1) deposition
P1 mask & etch
Blanket Vtn P− implant (NMOS Vt)
Vtp mask & N− implant (PMOS Vt)
TFT Gox (70A PECVD) deposition
500 A P2 (crystalline poly-2) deposition
P2 mask & etch
Blanket LDN NMOS N− tip implant
LDP mask and PMOS P− tip implant
Spacer LTO deposition
Spacer LTO etch to form spacers & expose P1
Blanket N+ implant (NMOS G/S/D & interconnect)
P+ mask & implant (PMOS G/S/D & interconnect)
Ni deposition
RTA salicidation and poly re-crystallization (G/S/D regions & interconnect)
Dopant activation anneal
Excess Ni etch
ILD oxide deposition & CMP
C2 mask & etch
W plug formation & CMP
M1 deposition and back end metallization The TFT process technology consists of creating NMOS & PMOS poly-silicon transistors. In the embodiment in FIG. 12, the module insertion is after the substrate device gate poly etch and the ILD film is deposition. In other embodiments the insertion point may be after M1 and the ILD is deposition, prior to V1 mask, or between two metal definition steps.

After gate poly of regular transistors are patterned and etched, the poly is salicided using Nickel & RTA sequences. Then the ILD is deposited, and polished by CMP techniques to a desired thickness. In the shown embodiment, the contact mask is split into two levels. The first C1 mask contains all contacts that connect latch outputs to substrate transistor gates and active nodes. Then the C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module.

Then, a first P1 poly layer, amorphous or crystalline, is deposited by LPCVD to a desired thickness as shown in FIG. 12.1. The P1 thickness is between 50 A and 1000 A, and preferably 250 A. This poly layer P1 is used for the channel, source, and drain regions for both NMOS and PMOS TFT's. It is patterned and etched to form the transistor body regions. In other embodiments, P1 is used for contact pedestals. NMOS transistors are blanket implanted with P-doping, while the PMOS transistor regions are mask selected and implanted with N– doping. This is shown in FIG. 12.2. The implant doses and P1 thickness are optimized to get the required threshold voltages for PMOS & NMOS devices under fully depleted transistor operation, and maximize on/off device current ratio. The pedestals implant type is irrelevant at this point. In another embodiment, the $V_T$ implantation is done with a mask P– implant followed by masked N-implant. First doping can also be done in-situ during poly deposition or by blanket implant after poly is deposited.

Patterned and implanted P1 may be subjected to dopant activation and crystallization. In one embodiment, RTA cycle is used to activate & crystallize the poly after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the unreacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30-200 A range, desirably 70 A thick. The gate may be grown thermally by using RTA. This gate material could be an oxide, nitride, oxynitride, ONO structure, or any other dielectric material combination used as gate dielectric. The dielectric thickness is determined by the voltage level of the process. At this point an optional buried contact mask (BC) may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Then second poly P2 layer, 300A to 2000A thick, preferably 500A is deposited as amorphous or crystalline polysilicon by LPCVD as shown in FIG. 12.3. P2 layer is defined into NMOS & PMOS gate regions intersecting the P1 layer body regions, C1 pedestals if needed, and local interconnect lines and then etched. The P2 layer etching is continued until the dielectric oxide is exposed over P1 areas uncovered by P2 (source, drain, P1 resistors). The source & drain P1 regions orthogonal to P2 gate regions are now self aligned to P2 gate edges. The S/D P2 regions may contact P1 via buried contacts. NMOS devices are blanket implanted with LDN N-dopant. Then PMOS devices are mask selected and implanted with LDP P– dopant as shown in FIG. 12.4. The implant energy ensures full dopant penetration through the residual oxide into the S/D regions adjacent to P2 layers.

A spacer oxide is deposited over the LDD implanted P2 using LTO or PECVD techniques. The oxide is etched to form spacers. The spacer etch leaves a residual oxide over P1 in a first embodiment, and completely removes oxide over exposed P1 in a second embodiment. The latter allows for P1 salicidation at a subsequent step. Then NMOS devices & N+ poly interconnects are blanket implanted with N+. The implant energy ensures full or partial dopant penetration into the 100A residual oxide in the S/D regions adjacent to P2 layers. This doping gets to gate, drain & source of all NMOS devices and N+ interconnects. The P+ mask is used to select PMOS devices and P+ interconnect, and implanted with P+ dopant as shown in FIG. 12.5. PMOS gate, drain & source regions receive the P+ dopant. This N+/P+ implants can be done with N+ mask followed by P+ mask. The $V_T$ implanted P1 regions are now completely covered by P2 layer and spacer regions, and form channel regions of NMOS & PMOS transistors.

After the P+/N+ implants, Nickel is deposited over P2 and salicided to form a low resistive refractory metal on exposed poly by RTA. Un-reacted Ni is etched as shown in FIG. 12.6. This 100A-500 A thick Co-salicide connects the opposite doped poly-2 regions together providing low resistive poly wires for data. In one embodiment, the residual gate dielectric left after the spacer prevents P1 layer salicidation. In a second embodiment, as the residual oxide is removed over exposed P1 after spacer etch, P1 is salicided. The thickness of Ni deposition may be used to control full or partial salicidation of P1 regions. Fully salicided S/D regions up to spacer edge facilitate high drive current due to lower source and drain resistances.

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting latch outputs to substrate transistor gates require no C2 contacts. Contact plugs are filled with tungsten, CMP polished, and connected by metal as done in standard contact metallization of IC's as shown in FIG. 12.7. A TFT process sequence similar to that shown in FIG. 12 can be used to build complementary Gated-FET thin film devices. Compared with CMOS devices, these are bulk conducting devices and work on the principles of JFETs. A full disclosure of these devices are provided in application Ser. No. 10/413,808 entitled "Insulated-Gate Field-Effect Thin Film Transistors", filed on Apr. 14, 2003 and list as inventor Mr. R. U. Madurawe, the contents of which are incorporated herein by reference.

As the discussions demonstrate, memory controlled pass transistor logic elements provide a powerful tool to make switches. The ensuing high cost of memory can be drastically reduced by the 3-dimensional integration of configuration elements and the replaceable modularity concept for said memory. These advances allow designing a routing block to overcome the deficiencies in current FPGA designs. In one aspect, a cheaper memory element allows use of more memory for programmability. That enhances the ability to build large logic blocks (i.e. course-grain advantage) while maintaining smaller element logic fitting (i.e. fine-grain advantage). Furthermore larger grains need less connectivity: neighboring cells and far-away cells. That further simplifies the interconnect structure. A new interconnect structure utilizing the methods shown so far is discussed next.

A point to point switch in accordance with this teaching is shown in FIG. 13A. In that, point A is connected to point B with a substrate NMOS pass-gate 1310. Unlike U.S. Pat. No. 6,515,511 where the pass-gate is a thin-film transistor, this device is a high performance single crystal Si device to provide high conducting current when the device is on. The low performance TFT transistors are only used to build the configuration circuits shown in dotted box 1350. Configuration circuit 1350 is located vertically above the pass-gate transistor 1310. The configuration circuit 1350 includes a thin film transistor memory element. This memory element is either a volatile or a non volatile memory element. The volatile memory is comprised of DRAM, SRAM or optical memory device. The non-volatile memory is comprised of EPROM, EEPROM, ferro-electric, magnetic, fuse-link or anti-fuse element. FIG. 13A illustrates an SRAM embodiment for configuration circuit. The configuration circuit 1350 outputs a control signal $S_0$ to control pass-gate 1310. This $S_0$ voltage level may be at Vcc or ground based on memory bit polarity. The $S_0$ voltage may also be at an elevated Vcc when the SRAM is run at that higher Vcc level. The configuration circuit 1350 includes circuitry to write data into the memory element. Thus output $S_0$ can be programmed to logic 1 or logic 0 by changing memory bit polarity. The configuration circuit includes a plurality of memory bits to program a plurality of pass-gates. The memory elements in the configuration circuit are arranged in an array fashion to allow either individual access or row by row access or column by column access to memory elements. The configuration memory circuit includes generic SRAM memory based capability to store user specified data. Configuration circuit includes metal wires to provide some limited configuration signals, power and ground to memory elements. In one embodiment the SRAM memory is comprised of TFT devices to form the circuit shown in FIG. 4A, further comprising TFT transistors 401 and 402 to access the latch, and TFT CMOS inverters 403 and 404 to form a bistable latch. In preferred embodiment, signal line $S_0$ is provided to pass-gate 1310 in FIG. 13A by a contact plug formed through the insulator separating substrate transistors and TFT transistors.

The point to point switch with TFT configuration circuits in FIG. 13A is denoted by the symbol as shown in FIG. 13B. In FIG. 13B, the circle with a cross represents the vertically integrated configuration circuit containing a TFT SRAM memory (or any other 3-dimensional memory) element. The pass-gate in FIG. 13B represents a single crystal Silicon transistor fabricated on a substrate. This pass-gate could be constructed on SOI substrate, with TFT integrated above that to form configuration memory. A 4×4 Programmable crosspoint switch matrix utilizing the point to pint switch in FIG. 13A is shown in FIG. 13C. In FIG. 13C, every intersection point between the V-lines (V1 to V4) and H-lines (H1 to H4) is populated with a point to point switch. This could be fully populated as shown, or partially populated depending on the need. The configuration circuit for FIG. 13C has 16 memory elements and configuration access to change the memory data. A programmable means to configure the cross-point matrix include setting memory data to achieve a user specified connecting pattern. Compared to standard planar SRAM technology, the new cross-point switch has only the 16 wide pass-gates on the substrate, and 96 TFT transistors are moved vertically above that. SRAM contain CMOS structures and is impacted by N-well related spacing rules for latch-up prevention. For a typical 6 times the minimum width wide pass-gate area of 1x, 96 SRAM transistors take 2x more silicon foot print requiring a 3x silicon for the matrix. TFT has no such latch-up restrictions and both pass-gates and TFT SRAM take about the same layout area and 1x total Silicon. The new point to point switch allows almost a 66% reduction in silicon utilization for such wire connections.

FIG. 14 illustrates a bridge according to the innovation in Ser. No. 11/040,731 to reduce the total number of bi-directional buffers needed to construct a 5 terminal bridge. This bridge can be adapted to connect any number of wires. For N ports in the bridge, only one buffer such as the inverter pair 1511 & 1521 is needed. The bridges shown in Prior Art may need ($N^2$-N) buffers in one case, and 4N in another case; while the bridge in FIG. 14 needs only 1 buffer. Such a bridge is extremely useful to provide bi-directional buffer connections across a high number of wires.

Figure 15C:
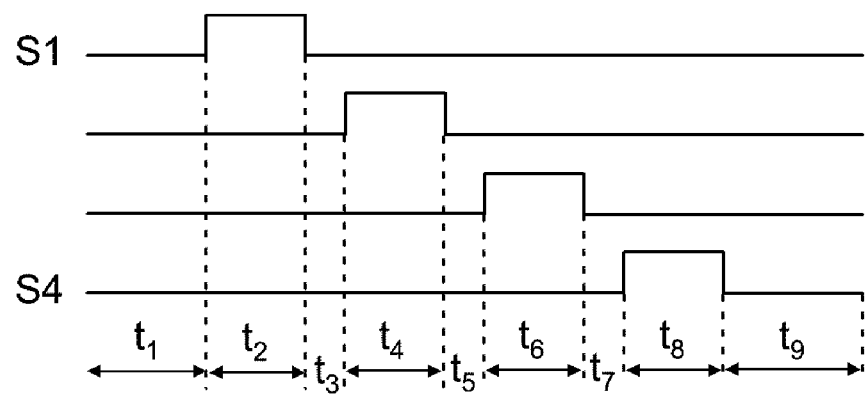
FIG. 15C shows a non-overlapping control signal timing diagram for time-multiplexing.

FIG. 15 illustrates a time multiplexing wire structure for logic outputs according to a first embodiment of this disclosure. FIG. 15A shows the construction of the output time multiplexing circuit, while FIG. 15B shows a second embodiment of that structure. In FIG. 15A, first wire 1501 is an output from a logic block. First wire 1501 is coupled to a plurality of pass-gate elements 1521-1524 that are configured by configuration elements 1511-1514 respectively. One of these elements is programmed to an ON state, while remaining three are programmed to an OFF state. It is possible for more than one element to be programmed to ON states for special time multiplexing schemes. The choice of the configurable element selects a control signal S1-S4 that selects the coupling of first wire 1501 to second wire 1502. The control signals S1-S4 may be gate signals for a second set of pass-gates 1531-1534 respectively. One familiar in the art may select NMOS, CMOS or other types of switches to construct FIG. 15A. If element 1512 is programmed to ON state of pass-gate 1522, and all other elements 1511, 1513 & 1514 are programmed to OFF state of pass-gates 1521, 1523 & 1524 respectively, then coupling of wire 1501 to wire 1502 depends on the control signal S2. A high state on control signals S1, S3 and S4 will not allow 1501 to couple to 1502. A high state on S2 will couple 1501 to 1502. In this manner, a user or a software tool can program one or more configurable elements to select a control signal that would couple 1501 to 1502. In FIG. 15A, S1 and S4 are non-overlapping control signals as shown in FIG. 15C. S1, S2, S3 and S4 are active high during $t_2$ $t_4$, $t_6$ and $t_8$ time intervals respectively. These signals may be global control signals, common to a plurality of logic blocks. These signals may be further pre-designed against skew similar to clock circuits. These control signals may be non overlapping clock signals that are pre-designed. The coupling of wire 1501 to 1502 is only during the time interval $t_2$, and the remaining time it is decoupled.

In FIG. 15B, each coupling path between wire 1540 and 1550 still comprises a programmable element, and a pass-gate: however, both are coupled into one element. The programmable element is a floating gate such as 1441. A configuration circuit provides the means to inject electrons to the floating gate, and remove electrons from the floating gate. The pass-gate 1551 is controlled by both the floating gate 1541 and the control signal S1. When the floating gate has electron charge, S1 is unable to activate pass-gate 1551. This provides the means to deselect the path. When the floating gate is neutral, a positive voltage on S1 couples wire 1540 to 1550. This provides the means to select the path. When S1 is zero, 1540 is decoupled from 1550. Thus a first voltage state on the control signal couples the two nodes, and a second voltage state decouples the two nodes on a selected path. The floating gate 1541 is not allowed to have a positive charge (called over-erase in EEPROM or Flash terminology), as that would violate the decouple condition between 1540 and 1550 during the second state of the control gate on a selected path.

Figure 15D:
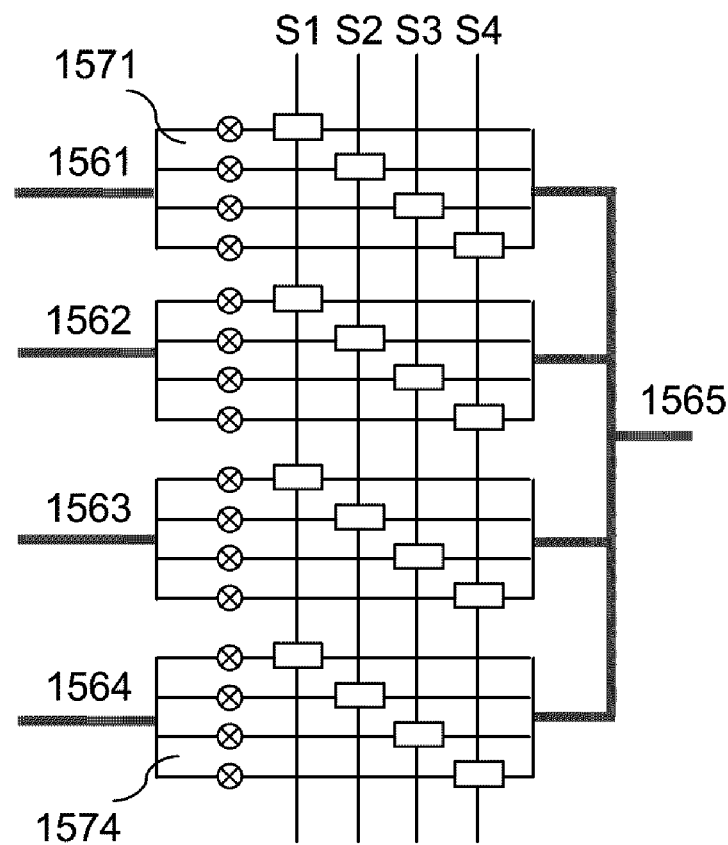
FIG. 15D shows another implementation for time-multiplexing.

FIG. 15D shows a set of four wires 1561-1564 coupled via the time multiplexing elements to a single wire 1565. Element 1571 is programmed to select control signal S1, 1572 to select signal S2, 1573 to select signal S3 and 1574 to select signal S4. It can be easily seen that wire 1561 may be programmed to select S2, S3 or S4 as the control signal. Wires 1561-1564 are sequentially coupled to the single wire 1565 during time intervals $t_2$, $t_4$, $t_6$ and $t_8$ respectively, only one wire coupled at one given time slot. Thus a single wire can relay the status of four different outputs in a time multiplexing manner. The time multiplexing slots can be changed with the number of control signals. It can be any number suitable for an optimal FPGA construction. In FIG. 15D, the signals received in wires 1561-1564 have to be in valid state when the control signals S1-S4 are activated. A software tool has the option to mix and match the valid state of the incoming signals to the four control signal "high" states, thus providing a significant leverage to optimize overall performance. In a preferred embodiment, the most critical signal may be assigned to the control signal S4, which is transmitted last in the data stream.

Figure 16:
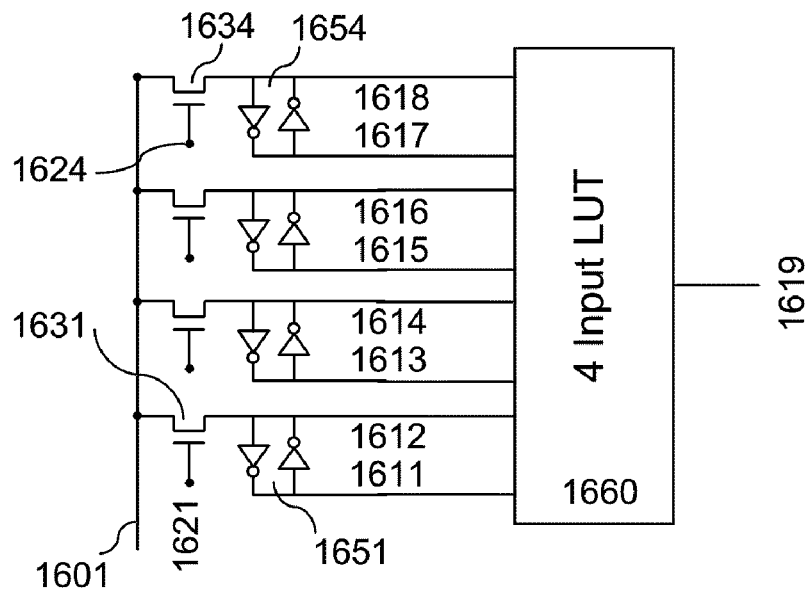
FIG. 16 shows a first embodiment of an input wire structure comprising time-multiplexed input signals.

FIG. 16 is a first embodiment of a wire structure to receive data from a wire that comprises time multiplexing. In the embodiment, a 4 input LUT structure (4LUT) is shown as the basic logic unit. The basic logic unit may be a MUX structure, an ALU, a P-Term structure or any other unit that receives inputs, performs a function based on the inputs, and provides one or more outputs. The 4LUT 1660 comprises 4 inputs received in true and compliment levels. Inputs 1611, 1612 is a first input pair, 1613, 1614 is a second input pair, 1615, 1616 is a third input pair, and 1617, 1618 is a fourth input pair. Each input pair is generated by an SRAM latch 1651-1654. A wire 1601 is common to all the latches 1651-1654. Each latch is gated by a pass-gate. Latch 1651 is gated by pass-gate 1631 which comprises a gate control signal 1621. When the control signal 1621 is high, the wire 1601 is able to write the data to the latch 1651. An input driver in the wire 1601 (not shown) is adjusted to have drive strengths to write valid data zero and one to latch 1651. In one embodiment, gate signals 1621 is coupled to S1, 1622 coupled to S2, 1623 is coupled to S3 and 1624 is coupled to S4. The timing diagram for S1-S4 is shown in FIG. 15C. Valid data on wire 1601 is latched to 1651 during time $t_1$, to 1652 during time $t_2$, to 1653 during time $t_3$, and to 1654 during time $t_4$. Thus four different data values are received in a time multiplexed wire and latched to 4 different latches accordingly. Thus only one wire 1601 is required to receive all four inputs necessary for 4LUT 1660. In conventional FPGA's that comprise 4LUTs, 4 dedicated wires are needed to bring the 4 input signals. Time intervals $t_1$ thru $t_4$ are chosen such that the valid data from the outputs have adequate time to traverse the wire length and latched into the said latches. In such designs, the hard-ware design can optimize the latching by a fixed delay between the S1-S4 signals received by the outputs, and by the inputs. In a preferred embodiment, the inputs global control signals S1-S4 can be delayed by a programmable delay that is varied from 0, $\tau$, $2\tau$, $3\tau$, . . . , $8\tau$ to provide a software tool flexibility to adjust proper latching of outputs to inputs at random locations of the device. In the discussion the time interval $\tau$ may 10 pico-seconds, or 50 pico-seconds, or 200 pico-seconds, and optimized as needed for the FPGA. For the 4LUT 1660, once the last input is latched, the output 1619 reaches a valid data status after the computing time delay of the 4LUT. The valid output data may be coupled to other wires as shown in FIG. 15A, or coupled to a flip-flop (not shown) and then coupled to a wire structure as in FIG. 15A.

Figure 17:
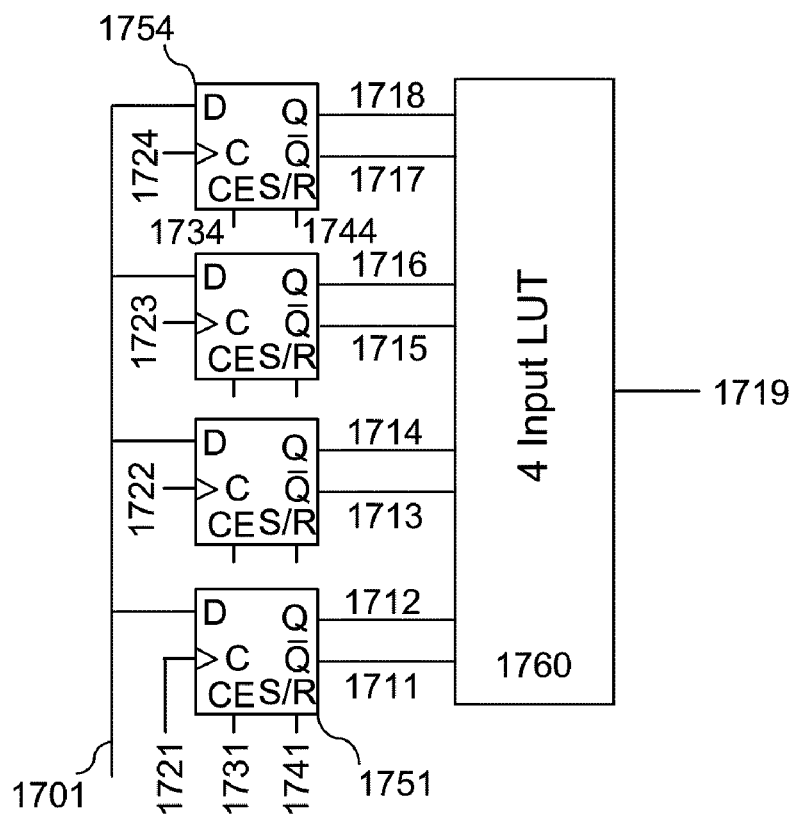
FIG. 17 shows a second embodiment of an input wire structure comprising time-multiplexed input signals.

FIG. 17 is a second embodiment of a wire structure to receive data from a wire that comprises time multiplexing. In the embodiment, a 4 input LUT structure (4LUT) is shown as the basic logic unit. The basic logic unit may be a MUX structure, an ALU, a P-Term structure or any other unit that receives inputs, performs a function based on the inputs, and provides one or more outputs. The 4LUT 1760 comprises 4 inputs received in true and compliment levels. Inputs 1711, 1712 is a first input pair, 1713, 1714 is a second input pair, 1715, 1716 is a third input pair, and 1717, 1718 is a fourth input pair. Each input pair is generated by a D-flip flop (DFF) 1751-1754. These may be registers, other types of flip-flops (S/R, master-slave, etc.) or other storage devices. A wire 1701 is common to all the DFFs 1751-1754. Each DFF (say 1751) comprises a D-input (common 1701), a clock (1721), a clock enable (1731) and a set/reset (1741) signal. All set/reset 1741-1744 may be a common wire. All clock enable 1731-1734 may be a common wire. In a first embodiment, clock inputs 1721 is coupled to S1, 1722 is coupled to S2, 1723 is coupled to S3, and 1724 is coupled to S4. DFF 1751 is gated by the clock input 1721. When the signal 1721 is high, the wire 1601 is able to write the data to the FF 1751. An input driver in the wire 1701 (not shown) is adjusted to have drive strengths to write valid data zero and one to DFF 1751. The timing diagram for S1-S4 is shown in FIG. 15C. Valid data on wire 1701 is latched to 1751 during time $t_1$, to 1752 during time $t_2$, to 1753 during time $t_3$, and to 1754 during time $t_4$. Thus four different data values are received in a time multiplexed wire and latched to 4 different DFFs accordingly. Other latching schemes may be adopted to write data to the DFFs. In a second embodiment, S1-S4 signals are coupled to clock-enable signals 1731-1734 such that each DFF is enabled sequentially. In yet another embodiment, signals S1-S4 are coupled to set/reset signals 1741-1744 such that each DFF is written sequentially. Thus only one wire 1701 is required to receive all four inputs necessary for 4LUT 1760. In conventional FPGA's that comprise 4LUTs, 4 dedicated wires are needed to bring the 4 input signals. Time intervals $t_1$ thru $t_4$ are chosen such that the valid data from the outputs have adequate time to traverse the wire length and latch into the said DFFs. In such designs, the hard-ware design can optimize the latching by a fixed delay between the S1-S4 signals received by the outputs, and by the inputs. In a preferred embodiment, the inputs global control signals S1-S4 can be delayed by a programmable delay that is varied from 0, $\tau$, $2\tau$, $3\tau$, . . . , $8\tau$ to provide a software tool flexibility to adjust proper latching of outputs to inputs at random locations of the device. In the discussion the time interval $\tau$ may 10 pico-seconds, or 50 pico-seconds, or 200 pico-seconds, and optimized as needed for the FPGA. For the 4LUT 1760, once the last input is latched, the output 1719 reaches a valid data status after the computing time delay of the 4LUT. The valid output data on wire 1719 may be coupled to a wire structure as shown in FIG. 15A, or coupled to a flip-flop (not shown) and then coupled to a wire structure as in FIG. 15A.

Figure 18:
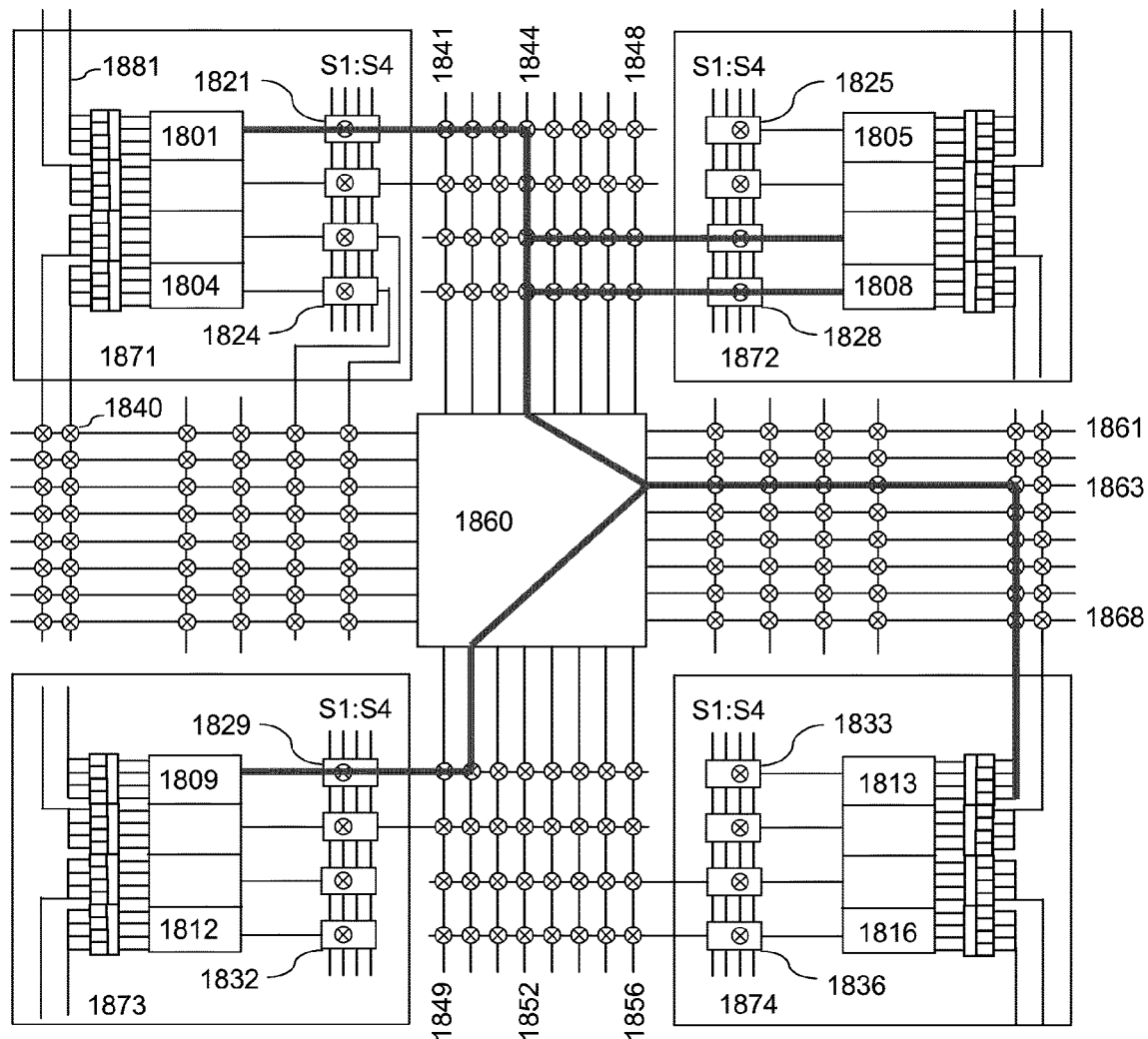
FIG. 18 shows four outputs connected to four inputs by a time multiplexed single wire route, and an FPGA floor-plan according to time-multiplexed wire structures.

FIG. 18 shows a portion of a new FPGA construction according to the time multiplexed wire structures described in FIGS. 15-17. In that, there are four tiles 1871-1874. Each tile is repeated in a similar array to form a structured array of tiles. The logic tiles are placed underneath a wire matrix, for illustrative purposes, the matrix is shown on either side of the tiles. There are horizontal wires such as 1861-1868 and vertical wires such as 1941-1956 inside the wire matrix. Each wire, as disclosed in this teaching, is a time multiplexed wire. These wires are segmented, and a segmented wire switch block 1860 provides coupling of horizontal and vertical wires as desired by the routing requirement. The switch block is a complex wire structure, requiring many wires to couple to many other wires in a programmable fashion. The complexity is proportional to $N^2$, N being the number of terminating wires. A reduction in the wires offer a quadratic reduction on the complexity and area of the switch block. The tile 1871 comprises four basic logic elements (BLE) 1801-1804. Each BLE 1801 is a 4LUT as disclosed in FIG. 16 or FIG. 17. BLE 1801 further comprises 4 inputs received in true and compliment levels, all inputs are received in a time multiplexed wire 1881. Thus only one wire is needed to feed BLE 1801. Similarly, only one wire is needed to provide the 4 required inputs to all BLEs 1801-1816 shown in FIG. 18. BLE 1801 comprises one output which goes to a time multiplexer selection block 1821, wherein one of global controls S1-S4 is programmed as the activating signal for the output. A buffered output signal enters the wire matrix, wherein programmable switch points such as 1840 allow the output to couple to one of many available wires. All inputs and outputs of BLEs are similarly constructed. One specific example of coupling the four inputs to BLE 1813 is illustrated in FIG. 18. The required four inputs are generated by BLEs 1801, 1807, 1808 and 1809 respectively. Each of those outputs are programmed to be activated by S1, S2, S3 and S4 global signals. The exact matching of the wire to control signal is optimized by the software tool to improve performance of the system. The horizontal segment of wire 1868 is shared by all 4 inputs in the time multiplex technique. The segment of wire 1844 is shared by three inputs, while the wire segment 1850 is unique to the output of BLE 1809. The place & route tool could have easily swapped BLE 1809 function to BLE 1802 location as all 4 input LUTs are swappable. Doing so would allow the output of BLE 1802 to couple to wire 1844, thus releasing wire 1850 for some other routing event. Thus this time sharing wire concept provides an added dimension of optimizing place & route feature in an FPGA, swapping individual time slot used wire segments with multiple time slot wire segments to improve routability in large logic placements.

In this disclosure, new time shared wires and wire structures are described to route data from logic block to logic block and across terminating wires. The selection structures to allow non-overlapping control signals to activate time multiplexed signals provide easy integration into software tools that provide place & route functions. Bi-directional wires with programmable buffers offer predictable and fast data transfer along short and long wires. It allows an FPGA construction where wire swapping and logic swapping is available for the placement and route soft-ware tool to optimize performance in randomly placed logic. More importantly, these wire structures allow a significant cost reduction in an FPGA; a 4 control signal scheme may allow a 2× reduction in wires in each horizontal and vertical track. As programmable wires comprise the lion share of the area overhead in an FPGA, a wire reduction offers very highly efficient FPGA construction. The time multiplexed wire structures in FPGA's enhance fitting, pin to pin routing, cost and performance of the FPGA.

A 3-dimensional SRAM process integration reduces the cost of re-programmability for these interconnect structures. Similarly, any other 3-dimensional memory technology will offer the same cost advantage. Such a 3D technology may be programmable fuse links, where the programming is achieved by a laser gun. It could be achieved by magnetic memory or ferro-electric memory. A method is also shown to map programmable elements to an application specific hardwire elements, wherein the wire delays are unaffected by the change. The conversion allows a further cost reduction to the user, thus providing an alternative technique in designing an ASIC thru an original FPGA device, and to reach FPGA logic densities approaching ASIC logic densities.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A time multiplexed programmable switch of a programmable logic device, the switch comprising:
   a first node and a second node; and
   a plurality of time multiplexed control signals, each signal coupled to a plurality of devices and having a non overlapping activation time interval; and
   a plurality of paths to couple the first node to the second node, each path comprising:
      a first device configured to an on state or an off state by a configurable element; and
      a second device configured to an on state or an off state by said time multiplexed control signal, the second device positioned in series with the first device;
   wherein, the first node is coupled to the second node by the path that comprises a first device that has an on state and during a time period when the second device has an on state.

2. The device of claim 1, wherein the on state of the second device of a said path does not overlap with the on state of the second device in any other of said paths.

3. The device of claim 1, wherein the first and second devices are integrated into a single device.

4. The device of claim 1, wherein one or both of said first and second device comprises a pass-gate transistor.

5. The device of claim 1, wherein the configurable element of the first device is one of a random access memory (RAM) element and a read only memory element (ROM).

6. The device of claim 1, wherein the configurable element of the first device comprises one of a volatile and non-volatile memory element.

7. The device of claim 1, comprising a configuration circuit.

8. The device of claim 1, comprising one of: a fuse link, an anti-fuse capacitor, an SRAM cell, a DRAM cell, a metal optional link, an EPROM cell, an EEPROM cell, a flash cell, a ferro-electric element, an electro-chemical cell, an electro-magnetic cell, a carbon nano-tube, an optical element and a magnetic memory element.

9. A time multiplexed programmable switch of a programmable logic device, the switch comprising:
   a plurality of nodes in a first set; and
   a second node; and
   a plurality of digital signals, each signal coupled to a plurality of devices and comprising a non overlapping activation time interval; and
   a plurality of paths to couple each node in the first set to the second node, each of said paths
      comprising:
      a first device configured to an on state or an off state by a configurable element; and
      a second device configured to an on state or an off state by said digital signal, the second device positioned in series with the first device;
   wherein, each node in the first set is selectively coupled to the second node by a path that comprises an on state of the first device and a time period during which the second device has an on state.

10. The device of claim 9, wherein no more than one of the first set nodes is coupled to the second node at any given time.

11. The device of claim 9, wherein the said second device within one coupling path from each said first set nodes to the second node share a common digital signal.

12. The device of claim 9, wherein a plurality of nodes in the first set is selectively coupled one node at a time to the second node by the digital signals.

13. The device of claim 9, wherein for the plurality of paths from each node in the first set to the second node, only one of the paths has a first device configured to on state.

14. The device of claim 9, wherein the first and second devices in series are integrated into a single device.

15. The device of claim 9, wherein one or both of said first and second device comprises a pass-gate transistor.

16. The device of claim 9, wherein a said configurable element of the first device is one of a random access memory (RAM) element and a read only memory element (ROM).

17. The device of claim 9, wherein a said configurable element of the first device comprises one of a volatile and non-volatile memory element.

18. The device of claim 9, comprising a configuration circuit.

19. The device of claim 9, comprising one of: a fuse link, an anti-fuse capacitor, an SRAM cell, a DRAM cell, a metal optional link, an EPROM cell, an EEPROM cell, a flash cell, a ferro-electric element, an electro-chemical cell, an electro-magnetic cell, a carbon nano-tube, an optical element and a magnetic memory element.

20. A time multiplexed programmable switch of a semiconductor device comprising:

a first node;

a plurality of digital signals, each signal coupled to a plurality of devices and comprising a non overlapping activation time interval; and a plurality of second nodes, each of the second nodes having a path to couple to the first node, the path comprising:

a first configurable device configured to select or deselect the path; and a second configurable device in series with the first configurable device configured to select or deselect the path by said digital signal;

wherein, the plurality of digital signals are time multiplexed to have no more than one second device in the select state within a time interval.

* * * * *